(12) United States Patent
Lloyd et al.

(10) Patent No.: US 11,460,507 B2
(45) Date of Patent: Oct. 4, 2022

(54) METHODS AND SYSTEMS FOR MONITORING THE HEALTH OF A BATTERY

(71) Applicant: Samsara Networks Inc., San Francisco, CA (US)

(72) Inventors: Kevin Russell Coates Lloyd, San Carlos, CA (US); Lucas Glenat, San Francisco, CA (US)

(73) Assignee: Samsara Inc., San Francisco, CA (US)

(*) Notice: Subject to any disclaimer, the term of this patent is extended or adjusted under 35 U.S.C. 154(b) by 124 days.

(21) Appl. No.: 16/987,971

(22) Filed: Aug. 7, 2020

(65) Prior Publication Data

US 2022/0043066 A1  Feb. 10, 2022

(51) Int. Cl.

| | |
|---|---|
| *G01R 31/374* | (2019.01) |
| *G01R 31/371* | (2019.01) |
| *G01R 31/3835* | (2019.01) |
| *G01S 19/01* | (2010.01) |
| *G01R 31/378* | (2019.01) |
| *G01R 31/392* | (2019.01) |
| *G01K 13/00* | (2021.01) |
| *H02J 7/00* | (2006.01) |

(52) U.S. Cl.
CPC .......... *G01R 31/374* (2019.01); *G01K 13/00* (2013.01); *G01R 31/371* (2019.01); *G01R 31/378* (2019.01); *G01R 31/3835* (2019.01); *G01R 31/392* (2019.01); *G01S 19/01* (2013.01); *H02J 7/005* (2020.01)

(58) Field of Classification Search
None
See application file for complete search history.

(56) References Cited

U.S. PATENT DOCUMENTS

| | | | |
|---|---|---|---|
| 2010/0231226 A1* | 9/2010 | Yamashita | ....... G01R 19/16542 324/433 |
| 2017/0350946 A1* | 12/2017 | Mukaitani | ........... H01M 10/482 |
| 2019/0011503 A1* | 1/2019 | Nagata | ................. G01R 31/388 |

* cited by examiner

*Primary Examiner* — Jas A Sanghera
(74) *Attorney, Agent, or Firm* — Nicholson, De Vos, Webster & Elliott, LLP

(57) ABSTRACT

A method and system for monitoring a non-rechargeable battery of an IoT device are described. Voltage values of the non-rechargeable battery when a load is applied to the non-rechargeable battery are determined over a first interval of time. Based at least in part on these voltage values a determination of whether a voltage of the non-rechargeable battery has decreased for more than a predetermined threshold is performed. In response to determining based at least in part on the voltage values that the voltage of the non-rechargeable battery has decreased for more than the predetermined threshold, a prediction of an end of life parameter value for the non-rechargeable battery is performed, and the end of life parameter value is transmitted to an electronic device of an administrator of the IoT device.

27 Claims, 13 Drawing Sheets

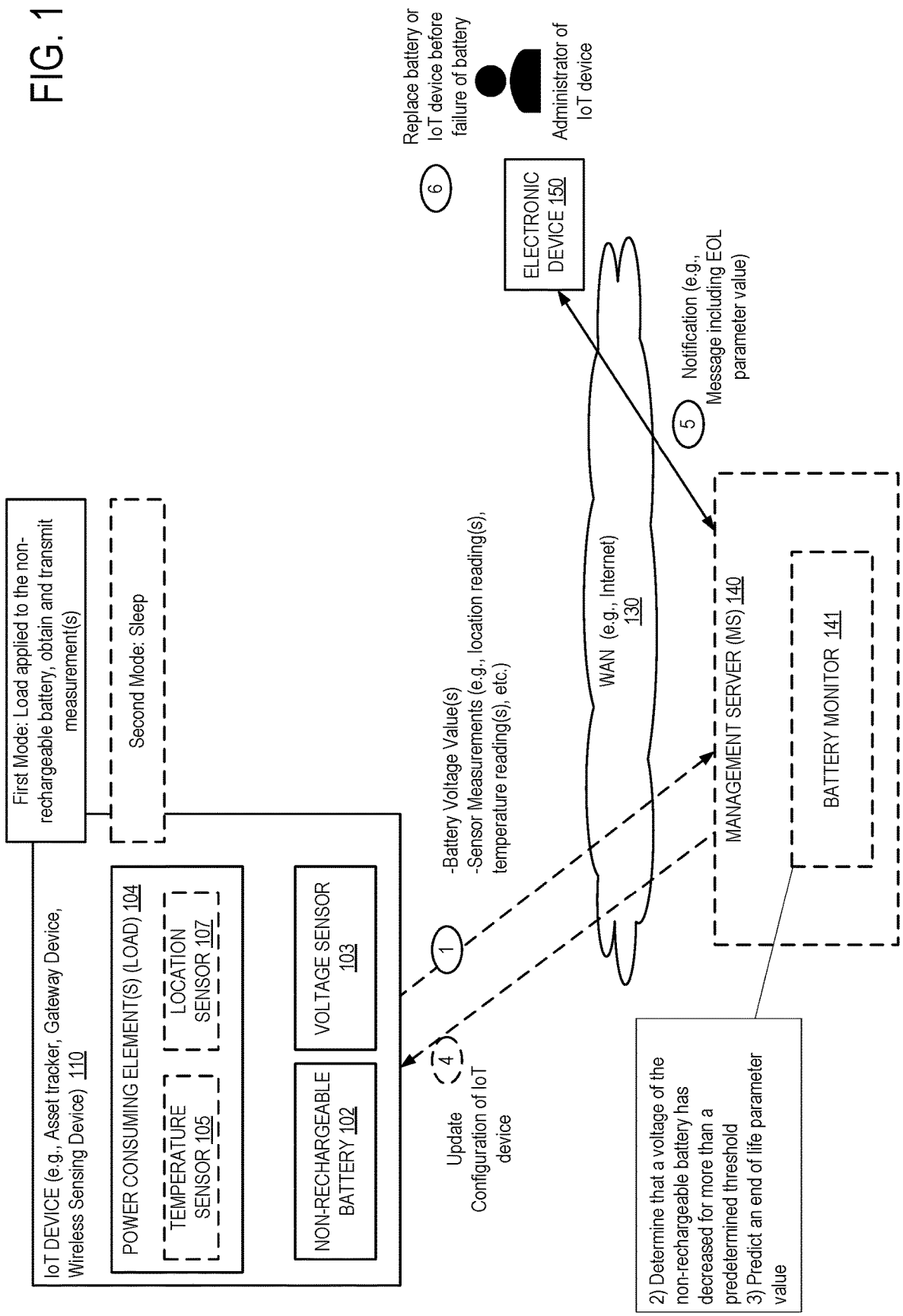

```
┌─────────────────────────────────────────────────────────────────────┐
│  DETERMINE, OVER A FIRST INTERVAL OF TIME, ONE OR MORE VOLTAGE      │
│  VALUES OF A NON-RECHARGEABLE BATTERY OF THE IOT DEVICE WHEN A      │
│  LOAD IS APPLIED TO THE NON-RECHARGEABLE BATTERY                    │
│                              202                                     │
│                                                                      │
│    ┌─────────────────────────────────────────────────────────┐      │
│    │ RECORD VOLTAGE READINGS OF A VOLTAGE PRODUCED BY THE    │      │
│    │ NON-RECHARGEABLE BATTERY RECORDED OVER A SECOND         │      │
│    │ INTERVAL OF TIME DURING WHICH THE LOAD IS APPLIED       │      │
│    │                         214                              │      │
│    └─────────────────────────────┬───────────────────────────┘      │
│                                  ▼                                   │
│    ┌─────────────────────────────────────────────────────────┐      │
│    │        DETERMINE A MINIMUM OF THE VOLTAGE READINGS      │      │
│    │                         216                              │      │
│    └─────────────────────────────┬───────────────────────────┘      │
│                                  ▼                                   │
│    ┌─────────────────────────────────────────────────────────┐      │
│    │        DETERMINE A MAXIMUM OF THE VOLTAGE READINGS      │      │
│    │                         218                              │      │
│    └─────────────────────────────┬───────────────────────────┘      │
│                                  ▼                                   │
│    ┌─────────────────────────────────────────────────────────┐      │
│    │        DETERMINE AN AVERAGE OF THE VOLTAGE READINGS     │      │
│    │                         220                              │      │
│    └─────────────────────────────────────────────────────────┘      │
└─────────────────────────────────────────────────────────────────────┘
```

FIG. 2B

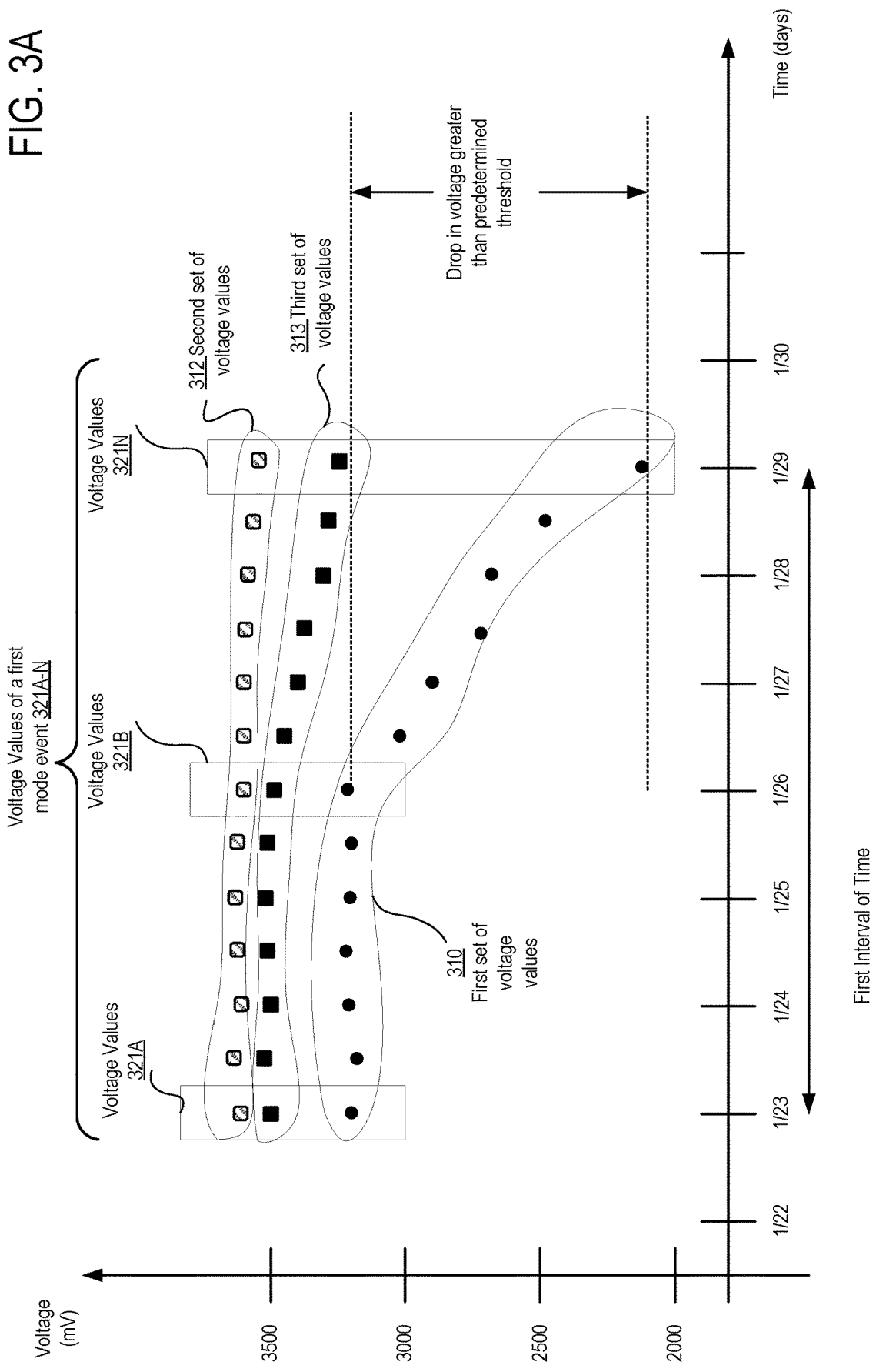

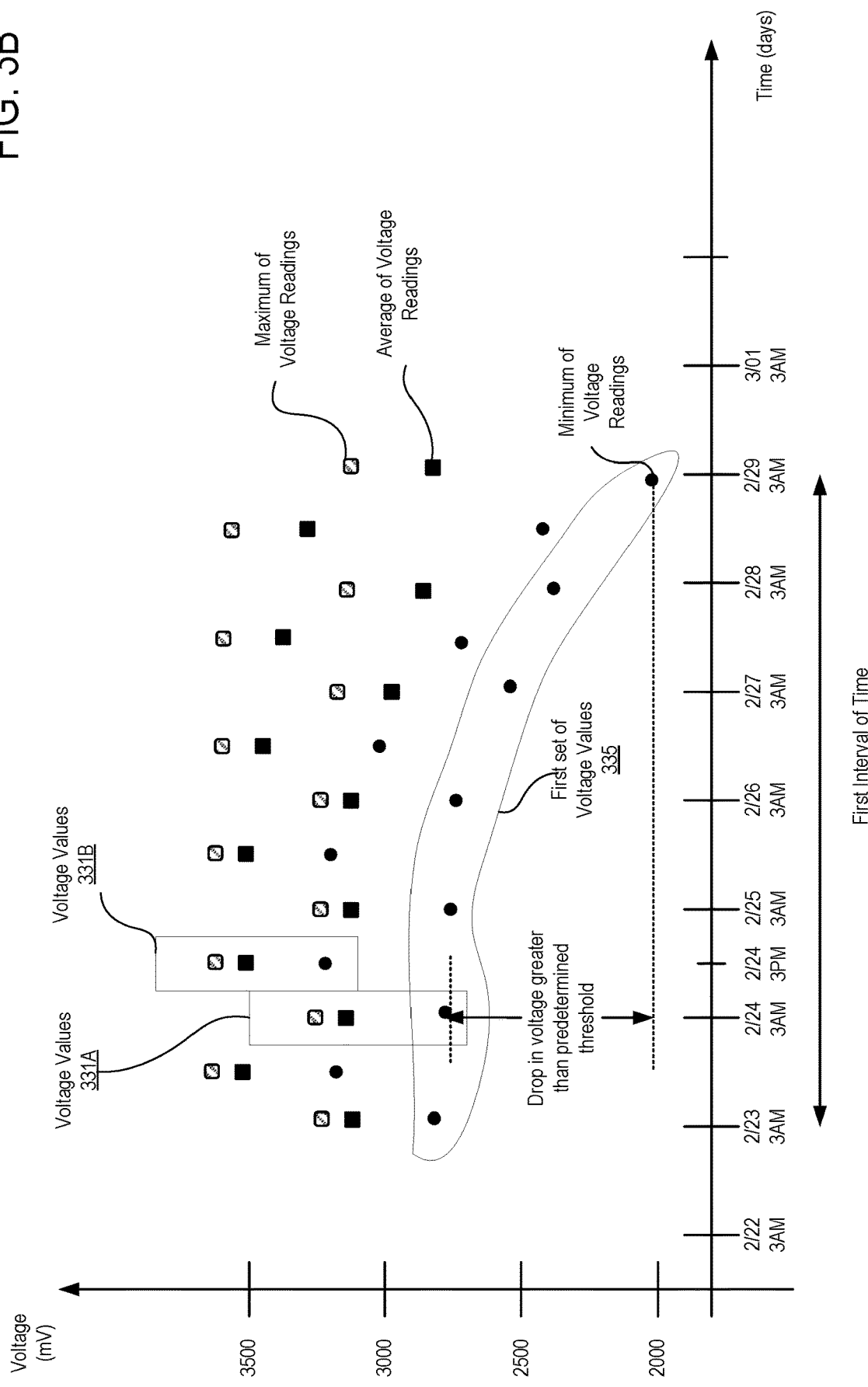

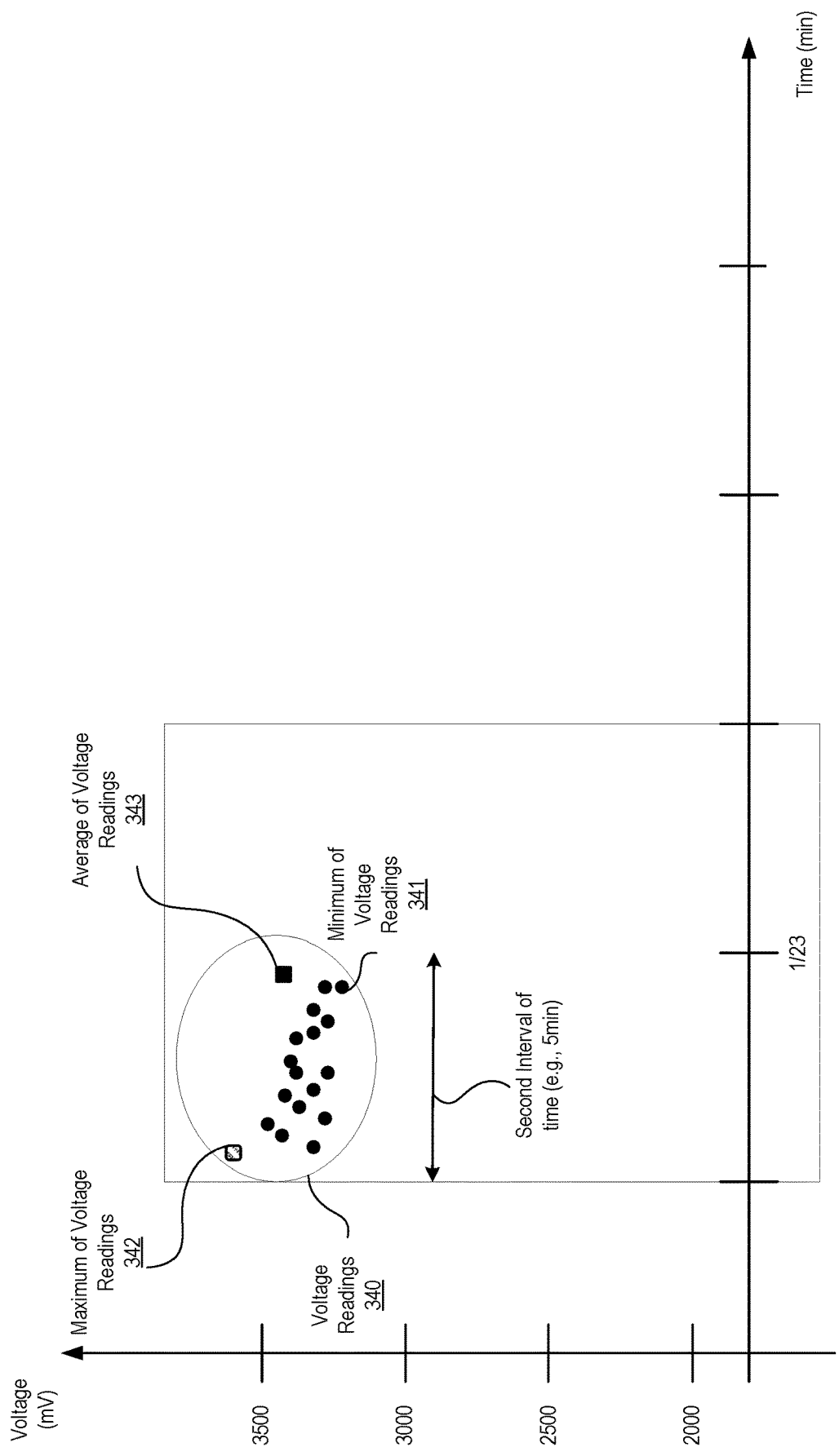

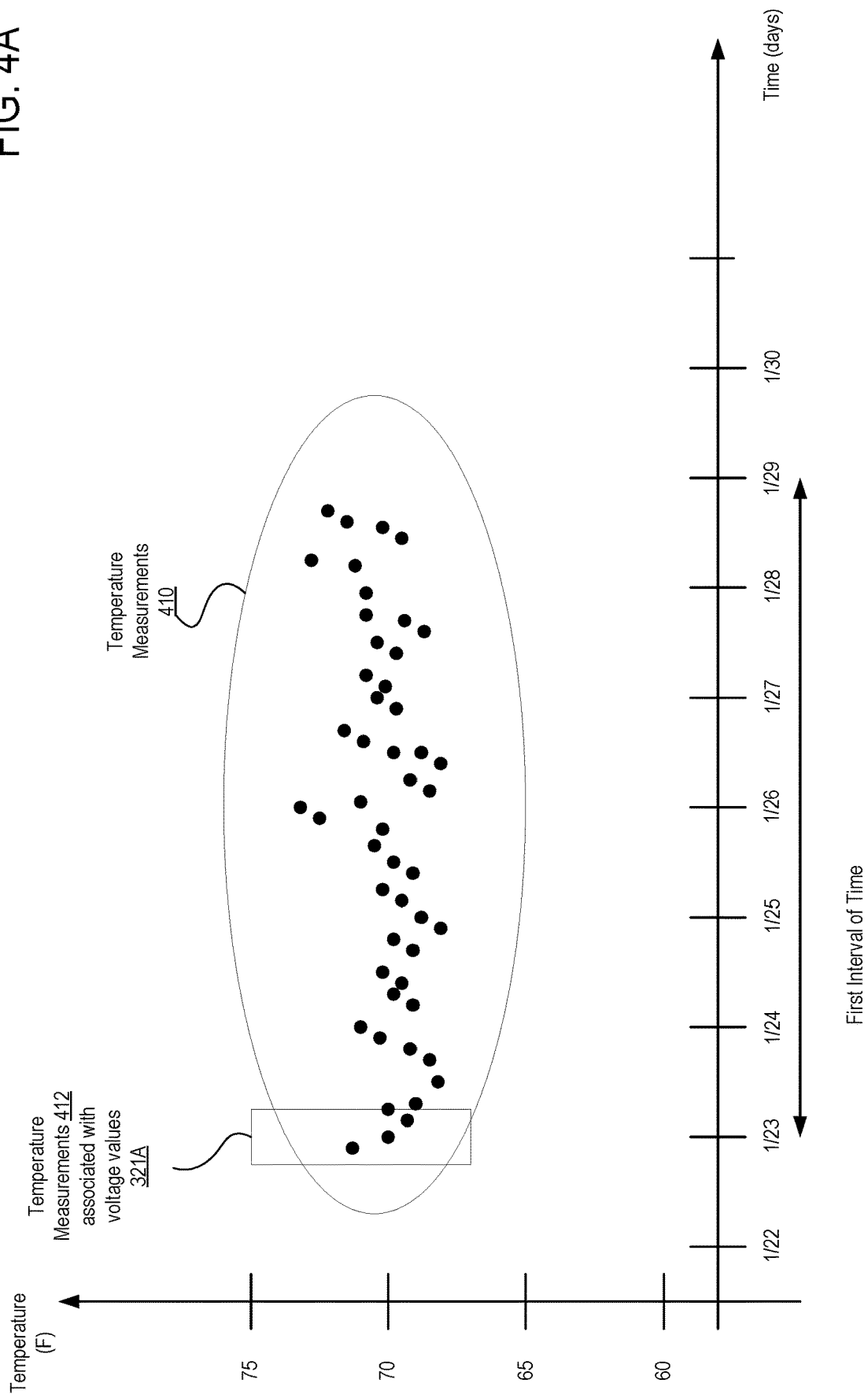

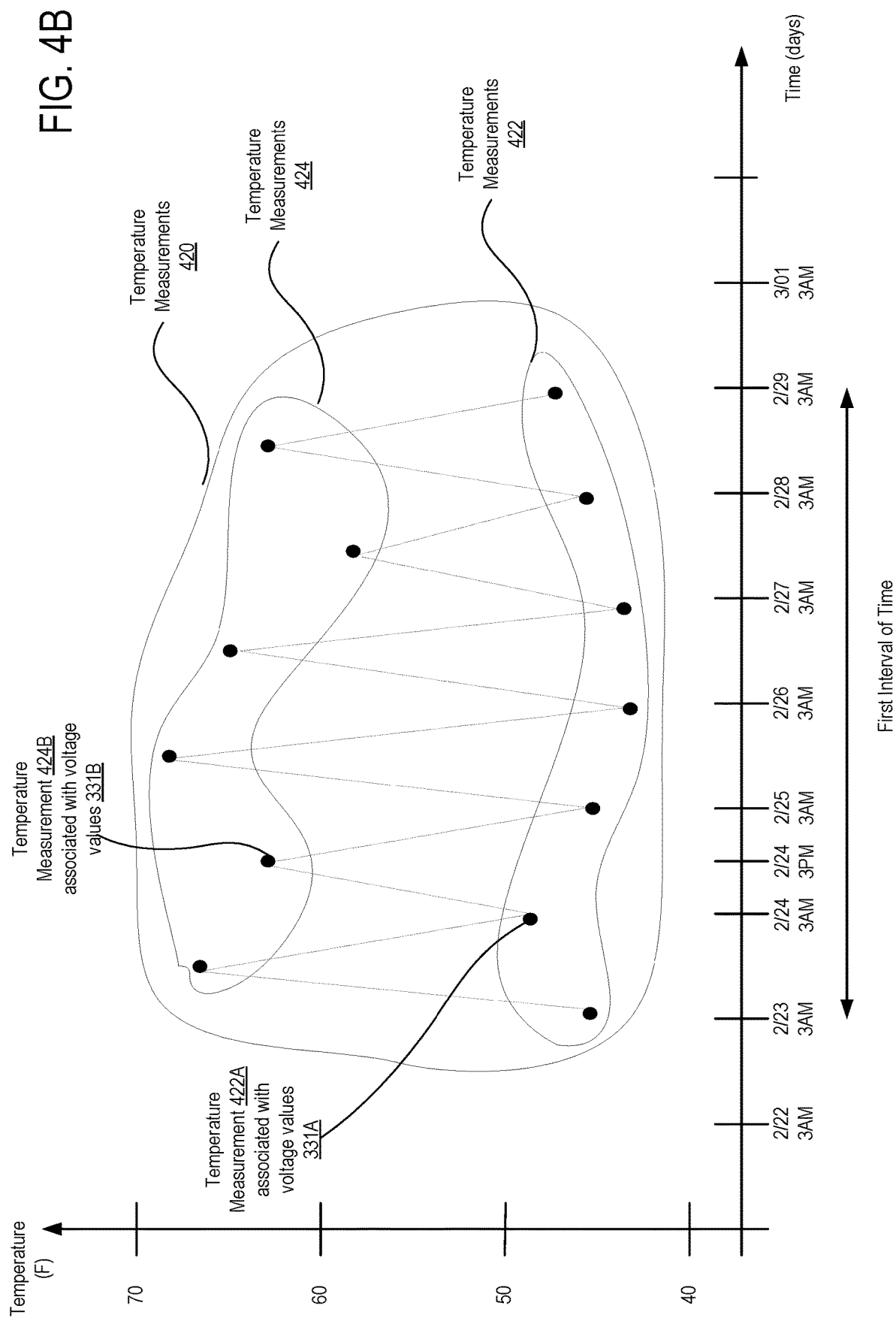

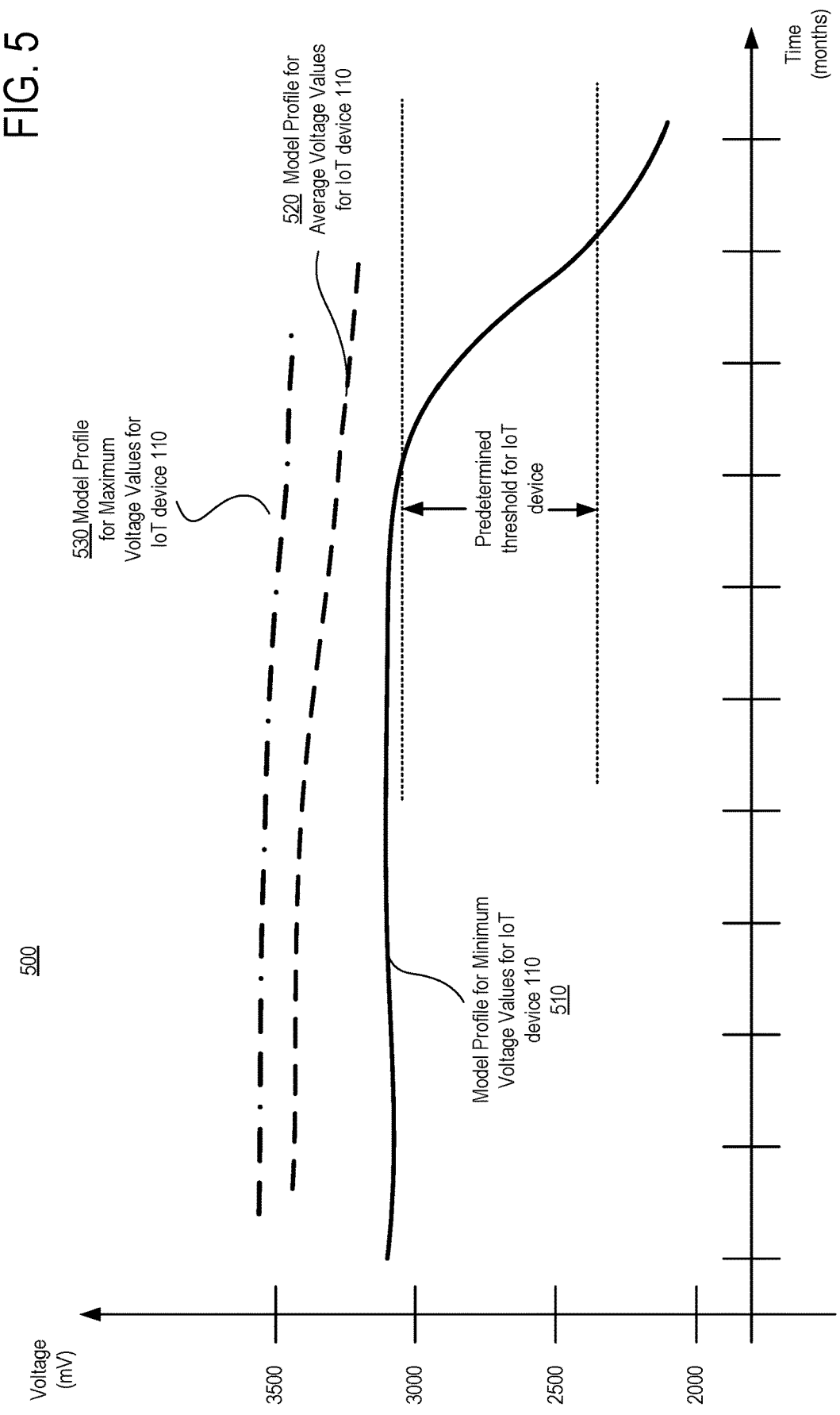

METHODS AND SYSTEMS FOR MONITORING THE HEALTH OF A BATTERY

TECHNICAL FIELD

One or more embodiments relate to the field of battery power management; and more specifically, to monitoring the health of a battery.

BACKGROUND ART

Batteries are used to store energy for use when needed by converting chemical energy into electrical energy. Non-rechargeable batteries (e.g., lithium thionyl chloride batteries), also known as primary battery or primary cells, are designed to be used once and discarded. In general, the electrochemical reaction occurring in the non-rechargeable battery is not reversible, rendering the cell unrechargeable. As the non-rechargeable battery is used, the chemicals in the battery are used up to generate power; when the chemicals are gone, the battery stops producing electricity. Non-rechargeable batteries have some important uses and their use (instead of secondary/rechargeable batteries) can be advantageous for some applications. For example, non-rechargeable batteries are often of higher capacity, easily accessible, generally less expensive, and less susceptible to high and low temperatures batteries (that is, they operate well at low and high temperature) than rechargeable batteries. Non-rechargeable batteries are used in pacemakers, remote controls, electronic keys, water meters, asset trackers, gateway devices.

In particular, non-rechargeable batteries can be deployed in electronic devices such as Internet of Things (IoT) devices (e.g., used in asset tracking and/or monitoring of sensor measurements). For example, the non-rechargeable batteries are used in trackers mounted on assets that do not include a power source, which would have been used to recharge the tracker. Different such IoT devices may have different communication abilities, such the ability to communicate to a back end or not, the ability to act as a gateway for other IoT devices to communicate to a back end or not, and/or an ability to communicate through a gateway to a back end. Some such IoT devices have a 2-5 years life expectancy due to battery failure depending on a number of factors (e.g., their configuration (e.g., how often the device is set to wake up, how much power is consumed when the device wakes up, etc.), environmental factors (e.g., temperatures), etc.). It is undesirable to have the battery fail (and then the device fail) while the IoT device is deployed out in the field.

BRIEF DESCRIPTION OF THE DRAWINGS

The following figures use like reference numbers to refer to like elements. Although the following figures depict various exemplary embodiments, alternative embodiments are within the spirit and scope of the appended claims. In the drawings:

FIG. 1 is a block diagram illustrating a system in which the health of non-rechargeable battery of an IoT device is monitored, according to some example embodiments.

FIG. 2B illustrates a flow diagram of exemplary operations that can be performed when the IoT device performs the determination of the voltage values, in accordance with some embodiments.

FIG. 3A illustrates a block diagram of exemplary voltage values of a given IoT device over multiple events, in accordance with some embodiments.

FIG. 3B illustrates block diagram of exemplary voltage values of a given IoT device over multiple events, in accordance with some embodiments.

FIG. 3C illustrates a block diagram of voltage values of an exemplary event, in accordance with some embodiments.

FIG. 4A illustrates a block diagram of exemplary temperature measurements recorded by the IoT device over time, in accordance with some embodiments.

FIG. 4B illustrates a block diagram of exemplary temperature measurements recorded by the IoT device over time, in accordance with some embodiments.

FIG. 5 illustrates an exemplary model voltage profile of an IoT device, in accordance with some embodiments.

DETAILED DESCRIPTION

Figure 2A:
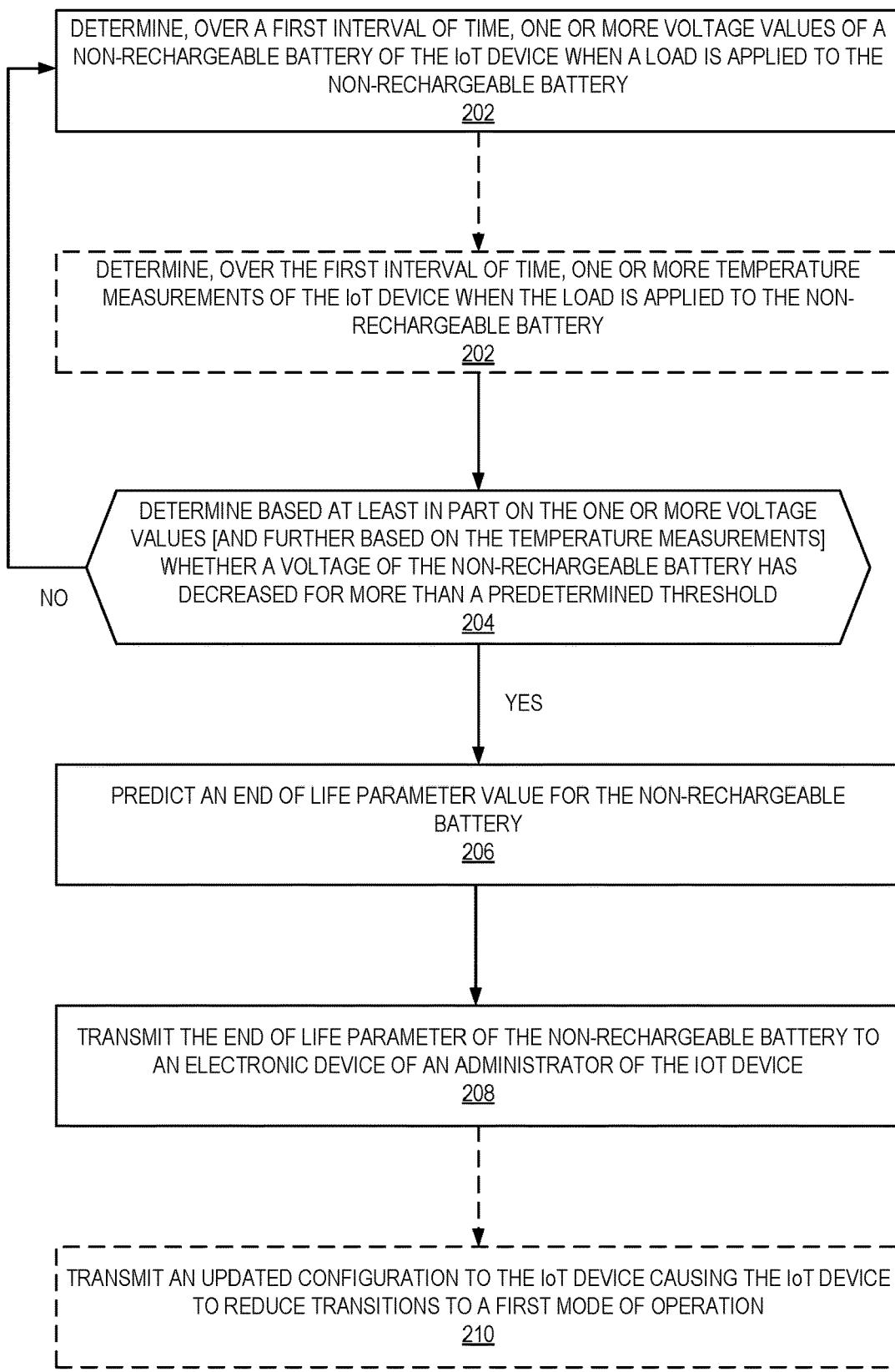
FIG. 2A illustrates a flow diagram of exemplary operations that can be performed for monitoring a non-rechargeable battery of an IoT device, in accordance with some embodiments.

The following description describes methods and apparatus for monitoring the health of a battery of an IoT device. IoT devices are deployed and used to support a variety of applications and use cases. In non-limiting examples, the IoT devices can be used in fleet management applications, asset tracking applications, industrial applications (manufacturing analytics, process monitoring, condition monitoring), and remote monitoring of environments (such as in factories, warehouses, etc.), etc. Non-rechargeable batteries are preferred to rechargeable batteries in a variety of applications as they are less expensive, have greater accessibility, have higher capacity, and have high tolerance to changes in temperatures.

Generally, a non-rechargeable battery provides few years of life expectancy (e.g., few months, 2-5 years, or 10-20 years) to an IoT device before failure. This life expectancy depends on a number of factors such as configuration of the IoT device (e.g., how often the device is set to wake up or transmit data, how much power is consumed when the device wakes up, etc.) and/or environmental factors (e.g., temperatures). It is undesirable to have the battery fail (and the device fail) while the IoT device is deployed out in the field. As such, it is desirable to predict the end of life (EOL) of a battery.

One technique to predict EOL of a battery for such devices is to use a specific integrated processing component for measuring the discharge of the battery. The integrated processing component is called a "Coulomb Counter" or "Fuel Gauge." However, these components have the disadvantage that they draw a power from the battery when operating (and therefore participate to the discharge of the battery) and further increase the manufacturing cost of an IoT device. Some techniques rely on counters that record the number of communications exchanged between the IoT device and a remote server as an indication of the number of measurements performed by the IoT device. However, these techniques are inaccurate as even if the time spent awake by an IoT device and/or the time spent by the IoT device communicating with the backend are measured, the actual charge of the battery that is consumed during that time frame cannot be measured and depends on the intensity of the current drawn during that time, which itself can depend on a number of factors such as temperature, strength of the cellular signal, etc. rendering a prediction of the remaining life of the IoT device based on these communications inaccurate. Other techniques may rely on voltage readings of the non-rechargeable battery when there is no load applied to the battery. However, these techniques do not work for all types of non-rechargeable batteries as the voltage in some of these non-rechargeable batteries, such Lithium thionyl chloride batteries, remains constant and drops only very near to the EOL. In fact, the voltage drops so close to the EOL that by the time it can be detected, the battery charge is insufficient to provide the power necessary for the IoT device to wake-up from a sleep mode and transmit the voltage value. As such, measuring the battery voltage with no load to perform an EOL prediction does not work well. The existing techniques used for predicting the EOL of non-rechargeable batteries are unreliable and not precise. They may cause the IoT device to fail earlier than expected by a system that is estimating a life expectancy for the IoT device. There is a need for a more accurate prediction of EOL of a non-rechargeable battery to avoid failure of the IoT devices in the field.

Overview

The embodiments described herein present methods and systems for monitoring battery voltage. The embodiments enable the accurate prediction of the end of life of a non-rechargeable battery. In one embodiment, it was determined that IoT devices that use non-rechargeable batteries can use a more accurate technique for predicting the EOL of the battery. This prediction can be used for a variety of purposes, including providing sufficiently early notifications to an administrator of the IoT device to allow for replacement of the battery or the entire device before the existing battery fails. In some embodiments, the IoT devices have accurate, high sampling frequency voltage sensors. In some embodiments, the IoT devices have temperature sensors and/or an ability to report sensor measurements to a backend server.

In some embodiments, a method and system for monitoring a non-rechargeable battery of an IoT device are presented. Voltage values of the non-rechargeable battery when a load is applied to the non-rechargeable battery are determined over a first interval of time. Based at least in part on these voltage values a determination of whether a voltage of the non-rechargeable battery has decreased for more than a predetermined threshold is performed. In response to determining based at least in part on the voltage values that the voltage of the non-rechargeable battery has decreased for more than the predetermined threshold, a prediction of an end of life parameter value for the non-rechargeable battery is performed, and the end of life parameter value is transmitted to an electronic device of an administrator of the IoT device.

FIG. 1 is a block diagram illustrating a system in which the health of a non-rechargeable battery of an IoT device is monitored, according to some example embodiments. The illustrated system includes an IoT device 110, a management server 140, and an electronic device 150. The electronic device 150 can be owned/operated by an administrator of the IoT device. The administrator can be an owner of the IoT device or an operator of the IoT device. In some embodiments, the IoT device is part of an IoT network that is managed through the management server 140.

The IoT device 110 is an electronic device that is operative to be coupled with the management server 140. In some embodiments, the IoT device can be located on a mobile asset (e.g., a vehicle, a truck, a trailer, etc.) or on a stationary asset (e.g., a voting booth, a wall, a water meter, etc.). In some embodiments, the asset is an unpowered asset (such as a trailer, portable toilet, a water meter, a voting booth, etc.). In other embodiments, the asset may be a powered system, however the IoT device 110 mounted on the asset may not have a permanent or constant access to the power source of the asset. In some embodiments, the IoT device is not plugged to the power source of the asset, while in other embodiments the IoT device may have an intermittent connection to the power source of the asset. The asset is typically located remotely from the management server 140 and may change location over a period of time or remain stationary at the same location.

The IoT device 110 is operative to be coupled with the management server 140 through a Wide Area Network (WAN) 130. The connection to the WAN 130 is a wireless connection (e.g., WiFi, cellular connection, etc.). In some embodiments, the IoT device 110 and the management server 140 may be subject to an intermittent connectivity with the WAN. The IoT device 110 can be implemented as described with reference to FIG. 7. In some embodiments, the IoT device 110 can be referred to as a gateway system and is operative to be coupled with other IoT devices, such as wireless sensing devices (WSDs), to receive/transmit data from/to the WSDs and transmit/receive this data to/from the management server 140. The wireless sensing devices (WSDs) are electronic devices that include one or more sensors for detecting physical events (e.g., temperature, humidity, barometric pressure, CO2 concentration, acceleration, pressure, sound, movement, etc.) and recording sensor measurements in response to the detection of these physical events. The WSDs can then store the sensor measurements related to physical events detected over a period of time. The WSDs may record sensor measurements at regular intervals of time (e.g., the WSDs may detect the temperature of a room, or an object (e.g., refrigerator, food product), and record corresponding temperature measurements every N seconds or minutes). The sensor measurements are stored in a non-transitory computer readable medium of the WSDs. Each of the WSDs is operative to be coupled to the gateway system and establish a communication channel to transfer the recorded sensor measurements. In some embodiments, each of the WSDs can connect to the gateway system through a wireless communication interface (e.g., Bluetooth Low Energy (BLE), WiFi). Thus, the WSDs are operative to detect a gateway system and negotiate a connection to the gateway system. In some embodiments, the IoT device 110 can be a WSD that is operative to be coupled with gateway systems for transmitting/receiving data to/from the management server 140. When compared to a gateway system, a WSD is a smaller and less complex device. For example, a WSD may not include a cellular network interface, while a gateway device may include the cellular communication interface. In these example embodiments the gateway system connects to the management server through the cellular communication (and/or WiFi) and the WSD connects to the gateway system through a short-range communication interface such as a Bluetooth LE interface. In other embodiments, the IoT device 110 can be an electronic device that includes one or more sensors for detecting physical events (e.g., temperature, humidity, barometric pressure, CO2 concentration, acceleration, pressure, sound, movement, etc.) and is operative to record sensor measurements in response to the detection of these physical events and to communicate with the management server through the cellular network.

The IoT device 110 includes a non-rechargeable battery 102 (also referred to herein as battery), a voltage sensor 103, and one or more power consuming element(s) 104. The power consuming elements may include a non-transitory computer readable storage medium, and one or more processing units as well as one or more sensor(s) (such as temperature sensor 105 and location sensor 107). The IoT device 110 is operative to record or obtain data related to an asset on which it is mounted or the environment in which it is located. The IoT device 110 is operative to transmit the data to the management server 140 through the WAN. The IoT device 110 is operative to record and transmit battery voltage values of the non-rechargeable battery 102 when a load is applied to the non-rechargeable battery. In some embodiments, the data further includes additional sensor measurements (such as temperature readings, location readings, etc.). The battery 102 is used to power the IoT device 110. When the IoT device 110 is in operation a load is applied to the battery 102. The load includes the power consuming elements 104 and the voltage sensor 103. The voltage sensor 103 is operative to measure voltage readings of a voltage that is produced by the battery 102. On one embodiment, the voltage sensor 103 has a high accuracy measurement capability and a high measurement frequency (e.g., the voltage can be sampled at 50 kHz with 15 μs sampling time, or other examples of high frequencies and sampling times). In some embodiments, the IoT device 110 includes a temperature sensor 105. The temperature sensor 105 is operative to determine the temperature of the environment of the IoT device 110 and/or the temperature of an asset on which the IoT device is mounted. In some embodiments, the temperature sensor can be located outside of the IoT device 110 and coupled with the IoT device 110 through a wireless protocol (e.g., a short-range wireless communication protocol). In some embodiments, the IoT device 110 includes a location sensor 107. The location sensor 107 is operative to determine the location of the IoT device 110. For example, the location sensor 107 can be a Global Positioning System (GPS) sensor that records GPS coordinates. In some embodiments, the location sensor can be located outside of the IoT device 110 and coupled with the IoT device 110 through a wireless protocol (e.g., a short-range wireless communication protocol). In other embodiments, the IoT device 110 may include or may be coupled with one or more other sensors (not illustrated).

The IoT device 110 is operative to operate in one or a plurality of modes of operations. In one embodiment, the IoT device 110 can operate in a single mode, e.g., the first mode described herein. In another embodiment, the IoT device 110 can operate in at least two different modes of operations. For example, in a first embodiment, the IoT device 110 can operate in a first mode and a second mode such as the ones described in further detail herein. In a second embodiment, the IoT device 110 can operate in more than two modes of operation, e.g., a full mode of operation where all components of the IoT device are enabled, one or more intermediary modes of operation where different subsets of components of the IoT device are enabled, and a sleep mode of operations, where a smallest subset of components (e.g., a microcontroller that controls the operation of the IoT device 110) of the IoT device 110 are enabled.

In one embodiment, the IoT device 110 is operative to operate in a first mode of operation. The first mode of operation may be referred to as an active mode of operation. In the first mode of operation sensor measurements are recorded and/or obtained by the IoT device 110 to be transmitted to the management server 140. In the first mode of operation the IoT device 110 may transmit the recorded sensor measurements to the management server. In some embodiments, the sensor measurements may include temperature measurements, location readings, and/or one or more other types of sensor measurements. In some embodiments, the IoT device 110 is configured such that relatively the same operations are performed by the IoT device 110 when operating in the first mode. For example, a succession of operations including obtaining sensor measurements (from internal and/or external sensors), establishing a connection with another device (e.g., the management server 140, gateway system, or WSD), and transmitting the sensor measurements to this other device can be performed. Additional or less operations can be performed without departing from the scope of the present embodiments. For example, receiving data and/or configuration parameters from the management server 140 may be part of these operations, and/or receiving data from or transmitting data to one or more WSDs or gateway devices may also be part of these operations. Having substantially the same operations performed in the IoT device 110 when it operates in the first mode results in having substantially the same load being applied to the battery 102 when the first mode operates in this mode. Further, while the voltage produced by the battery 102 depends on the load when this load remains substantially the same a similar voltage is expected to be produced by the battery unless the battery is nearing its end of life. For example, for an IoT device that communicates with a backend server over a cellular connection, the load often peaks when the cellular connection is in use. Thus, when the first mode is a mode of operation in which data is transmitted and/or received over the cellular connection, the load on the battery can be at its peak in this mode. While in some embodiments, the load on the battery is at its peak when the IoT device is transmitting or receiving data over the cellular connection, in other embodiments, the enablement of other components or features of the IoT device can cause the load on the battery to peak. In other embodiments, different operations can be performed by the IoT device over time when it operates in the first mode.

In some embodiments, the IoT device 110 is operative to operate in at least the first mode of operation, in which a greater load is applied to the battery 102, and a second mode of operation, in which a smaller load is applied to the battery 102. The second mode of operation can be referred to as a sleep mode. When operating in the second mode of operation, some or all of the operations performed in the first mode are not performed by the IoT device 110. For example, in some embodiments, the operations of recording sensor measurements and transmitting the sensor measurements to the management server 140 are not performed. In other embodiments, while the transmission/receipt of data may not be performed when in the second mode (e.g., the cellular communication is not in use), the recordation of the sensor measurements may be performed. In all embodiments, the load that is applied to the battery 102 when the IoT device 110 is in the second mode is less than the load that is applied to the battery 102 when the IoT device 110 is in the first mode consequently resulting in more power being drawn from the battery when the IoT device 110 is operating in the first mode than when it is operating in the second mode.

When in operation, the IoT device 110 periodically transitions from the first mode to the second mode or from the second mode to the first mode. In some embodiments, the transition between the first mode and the second mode can be performed at predetermined regular intervals of time. For example, the IoT device 110 can be configured to operate in the first mode once a day, twice a day, once per hour, or every other day. Other frequencies can be considered depending on the type of application and uses of the IoT device 110. For example, when the IoT device 110 is mounted on an asset that needs to be located while the asset is moving, the IoT device 110 may operate in the first mode of operation at a higher frequency, i.e., the IoT device 110 may wake up and go to sleep at a high frequency (e.g., once an hour). Alternatively, when the IoT device 110 is mounted on an immobile asset the IoT device may operate in the first mode at a lower frequency, i.e., the IoT device may wake up and go to sleep at a low frequency (e.g., once a day). The IoT device 110 can be configured to operate in the first mode for an interval of time and transition to operate in the second mode once this interval of time has elapsed. Additionally or alternatively, the transition between modes of operations can be performed in response to internal and/or external events detected based on sensor measurements or timers. For example, the transition can be performed in response to determining that the asset on which the IoT device is mounted is in motion or alternatively has stopped moving. In another example, the transition can be performed in response to determining that a timer has expired. Multiple parameters and conditions can be used to trigger the transitions between the modes of operation for the IoT device. Additionally or alternatively, when the IoT device is operative to operate in more than two modes of operation, there are multiple types of transitions from one mode to another. These transitions can be scheduled at a given frequency or performed in response to internal or external events. In other embodiments, when the IoT device operates only in a single mode, e.g., first mode, there are no transitions.

The system further includes a management server 140. The management server 140 is a cloud-based server operative to receive data from one or more electronic devices (e.g., the IoT device 110). The data includes battery voltage values received from the IoT device 110. The data may further include sensor measurements such as temperature readings and/or location readings. In some embodiments, the management server 140 includes a battery monitor 141 that is operative to determine a value of an end of life parameter for the battery of the IoT device 110 based on the voltage values. The end of life (EOL) parameter can be a time left before the non-rechargeable battery fails, a number of wake-ups left to the IoT device before the non-rechargeable battery fails, a time before which the non-rechargeable battery and/or the IoT device need to be replaced, a percentage of the battery power remaining, etc. In some embodiments, the management server 140 may update the configuration of the IoT device based upon the EOL parameter value. In some embodiments, the management server 140 may transmit a notification and/or the EOL parameter value to an electronic device 150 of an administrator of the IoT device 110. In some embodiments, the management server 140 is implemented as described in further details with reference to FIG. 8. While the management server 140 is illustrated as being operative to be coupled with a single IoT device 110, one of ordinary skill in the art would understand that the management server 140 may receive/transmit data from/to multiple IoT devices. The IoT devices may belong to a single administrative entity (e.g., organization, household, person, etc.) or alternatively the IoT devices may belong to multiple administrative entities, which are also referred to as tenants.

In the embodiments described herein it is determined that voltage variances (and optionally temperature measurements) when a battery of an IoT device is under load can be used to predict the battery EOL for a specific IoT device. Specifically, when a device is asleep (i.e., operating in the second mode with low to no load), the voltage produced by the battery goes up to a known voltage range (e.g., 3.3 Volts (V)) and remains at that level until very close to the end of life of the battery. In contrast, the voltage produced by the battery under load is initially at a high level and starts to fall over time as the battery gets older. When the battery is new, if the IoT device 110 transitions to the first mode (e.g., wake-ups from a sleep mode) the load applied to the battery 102 goes up. During an event, which spans the second interval of time, the voltage of the battery 102 initially goes up and then drops to within a known range (e.g., 3.0V) depending on the load. As the battery gets older, the voltage drop starts to increase (e.g., down to 2.9V, 2.8V, . . . , 2.5V over time). This drop depends on the load applied to the battery and may also depend on the temperature. The voltage produced by the battery when the load is applied may further depend on the temperature of the environment in which the IoT device is located. The embodiments described herein use voltage values of a voltage produced over time by the battery 102 when under relatively the same load to predict EOL of the battery. In some embodiments described herein the prediction of the EOL of the battery can further depend on temperature measurements associated with the voltage values.

When operating in the first mode of operation, the voltage sensor 103 determines voltage readings by measuring the voltage produced by the battery 102. The voltage of the battery 102 is measured when a load is applied to the battery 102. When the IoT device is operative to operate in more than one mode of operation, the load applied in the first mode draws more charge from the battery 102 than what a load would draw from the battery 102 when the IoT device 110 operates in other modes (e.g., the second mode). In one embodiment, this load is substantially the same at each event. At operation 1, voltage values determined from the voltage readings are transmitted to the management server 140. The voltage values may include voltage readings, a minimum voltage of these voltage readings, a maximum voltage of these voltage readings, an average of these voltage readings, and/or other voltage values derived from the voltage readings (e.g., voltage readings that are subject to a low-pass filtering or a frequency analysis). In some embodiments, in addition to the voltage values, the IoT device 110 may also transmit sensor measurements (e.g., location readings, temperature readings, etc.). In some embodiments, the IoT device 110 may transition to another mode of operation (e.g., the second mode) after an interval of time (the second interval of time) has elapsed. The management server 140 receives the voltage values. At operation 2, the management server 140 determines that a voltage of the battery 102 has decreased for more than a predetermined threshold when compared to a reference voltage for the battery 102. At operation 3, the management server 140 predicts an end of life parameter value in response to determining that the voltage of the battery has decreased. In some embodiments, the management server 140 may update the configuration of the IoT device based on the EOL parameter value. Additionally or alternatively, at operation 5, the management server 140 transmits a notification to the electronic device 150 of the administrator of the IoT device 110. The notification may include the end of life parameter value.

While some embodiments herein describe some operations performed by the IoT device 110 and other operations performed by the management server 140, in other embodiments, the operations can be performed by the IoT device 110 only. For example, the IoT device 110 can perform operations 1, 2, 3, 4, and 5. In other embodiments, different combinations of these operations can be performed by the IoT device 110 and the management server 140. For example, operations 1, 2, 3 can be performed by the IoT device 110 and operations 4 and 5 are performed by the management server 140. Other combinations can be contemplated without departing from the scope of the present embodiments. The embodiments herein will be described in further detail with respect to the following flow diagrams and block diagrams.

Monitoring Health of a Non-Rechargeable Battery

The operations in the flow diagrams herein will be described with reference to the exemplary embodiments of the other figures. However, it should be understood that the operations of the flow diagrams can be performed by embodiments of the invention other than those discussed with reference to the other figures, and the embodiments of the invention discussed with reference to these other figures can perform operations different than those discussed with reference to the flow diagrams.

FIG. 2A illustrates a flow diagram of exemplary operations that can be performed for monitoring a non-rechargeable battery of an IoT device, in accordance with some embodiments. As will be described in further detail below, the operations of the flow diagram can be performed by the management server 140. Alternatively, some operations of the flow diagram can be performed by the management server 140 while others are performed by the IoT device 110. In other embodiments, the operations of the flow diagram are performed by the IoT device 110. FIGS. 3A-B illustrate block diagrams of exemplary voltage values of a given IoT device over multiple events, in accordance with some embodiments. FIG. 3C illustrates a block diagram of voltage values of an exemplary event, in accordance with some embodiments. The operations of the flow diagrams herein will be described with respect to these exemplary voltage values. However, one of ordinary skill in the art would understand that the values are intended to be exemplary and are presented for illustrative purposes only.

At operation 202, voltage values of a non-rechargeable battery of the IoT device when a load is applied to the non-rechargeable battery 102 are determined. The voltage values are determined over a first interval of time. The first interval of time is an interval of time during which the IoT device 110 is deployed and is being used to record measurements. In FIGS. 3A-B, the first interval of time spans few days. However, in other embodiments, the interval of time can span multiple weeks, months, up to few years (e.g., 2-5 years, 10 years, etc.). While the first interval of time can represent the entire time during which the IoT device 110 is deployed, in other embodiments, the first interval of time can be less than the entire time during which the IoT device 110 is deployed. An event in this interval of time occurs during a second interval of time during which voltage values are recorded. In some embodiments, the event occurs (i.e., voltage values are recorded) when the IoT device is operating in the first mode. Additionally or alternatively, the events can occur when the IoT device is operating in one or multiple ones of operating modes. During the first interval of time one or more of these events can occur. In some embodiments, voltage values associated with a single event are determined. For example, the voltage values 321A of an event that occurred on January 23 can be determined. While in the figures an event is associated with a date (e.g., January 23), typically an event lasts for a limited second interval of time and not an entire day. In the illustrated example of FIG. 3A, there are two events per day. As it will explained in further detail with reference to FIG. 3C, each one of the events may last for few seconds or few minutes (e.g., 30 sec, 1 min, 5 min, 10 min, etc.). Thus, in this exemplary scenario an IoT device is configured to record voltage values for the duration of the second interval of time (e.g., 5 min) twice a day. In other scenarios, voltage values can be recorded for more than two events. The voltage values may include voltage readings, a minimum voltage of these voltage readings, a maximum voltage of these voltage readings, an average of these voltage readings, and/or other voltage values derived from the voltage readings (e.g., voltage readings that are subject to a low-pass filtering or a frequency analysis). The determination of the voltage values can be performed according to one of multiple embodiments as described with reference to FIGS. 2C-D.

In some embodiments, the operations of the flow diagram of FIG. 2A can be performed by the IoT device 110. In these embodiments, operation 202 is performed by the IoT device. FIG. 2B illustrates a flow diagram of exemplary operations that can be performed when the IoT device performs determination of the voltage values. The operations 214-220 are performed for a single event. However, the determination of the voltage values may include several of these events. At operation 214, the IoT device 110 records over a second interval of time during which the load is applied, with the voltage sensor 103, voltage readings of the voltage produced by the non-rechargeable battery. At each event, the IoT device records voltage values for the duration of the second interval of time. FIG. 3C illustrates a block diagram of exemplary voltage values that can be determined during an event, in accordance with some embodiments. The voltage readings 340 are recorded during a second interval of time, which is the duration of the event 320A. In some embodiments, the second interval of time may occur when the IoT device is operating in the first mode between two transitions from another and to another mode. In other embodiments, the IoT device does not transition to other modes of operation and the second interval of time is not associated with mode transitions. The voltage readings 340 are recorded at a given frequency (e.g., 50 Hz) and corresponding sampling time (20 μs). Other frequencies can be considered. In some embodiments, the voltage sensor 103 is a high frequency high accuracy voltage sensor. In a non-limiting example, the second interval of time can be 5 min. Other intervals of time can be considered. At operation 216, the IoT device 110 determines a minimum of the voltage readings. The minimum voltage reading, e.g., 341, is the smallest readings when compared with all the voltage readings 340 recorded during the second interval of time. The minimum voltage reading 341 is smaller than or equal to all of the other voltage readings recorded during the second interval of time. At operation 218, the IoT device 110 determines a maximum of the voltage readings. The maximum voltage reading, e.g., 342, is a voltage reading that is greater than or equal to all of the other voltage readings recorded during the second interval of time. At operation 218, the IoT device 110 calculates an average voltage reading from the voltage readings. In some embodiments, the IoT device 110 may calculate additional or alternative voltage values based on the voltage reading (e.g., low pass filter or frequency analysis can be performed on the voltage readings).

Figure 2D:
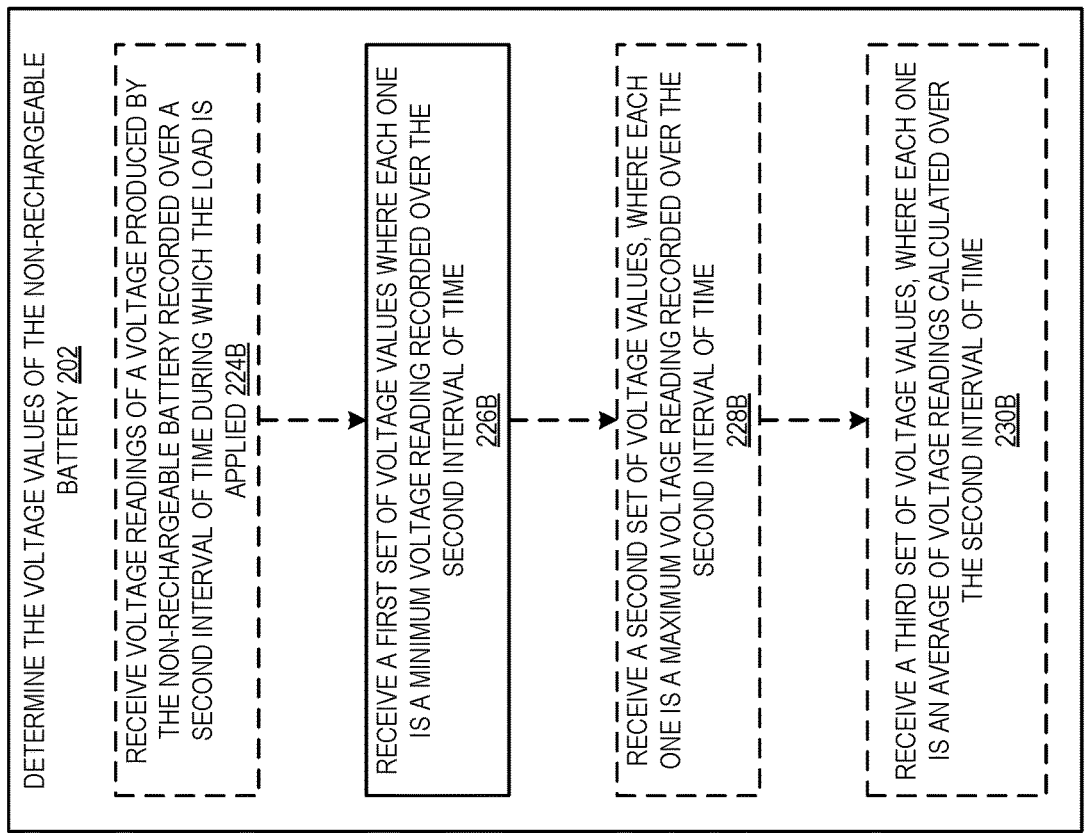
FIG. 2D illustrates a flow diagram of exemplary operations that can be performed when the management server performs the determination of the voltage values, in accordance with some embodiments.
Figure 2C:
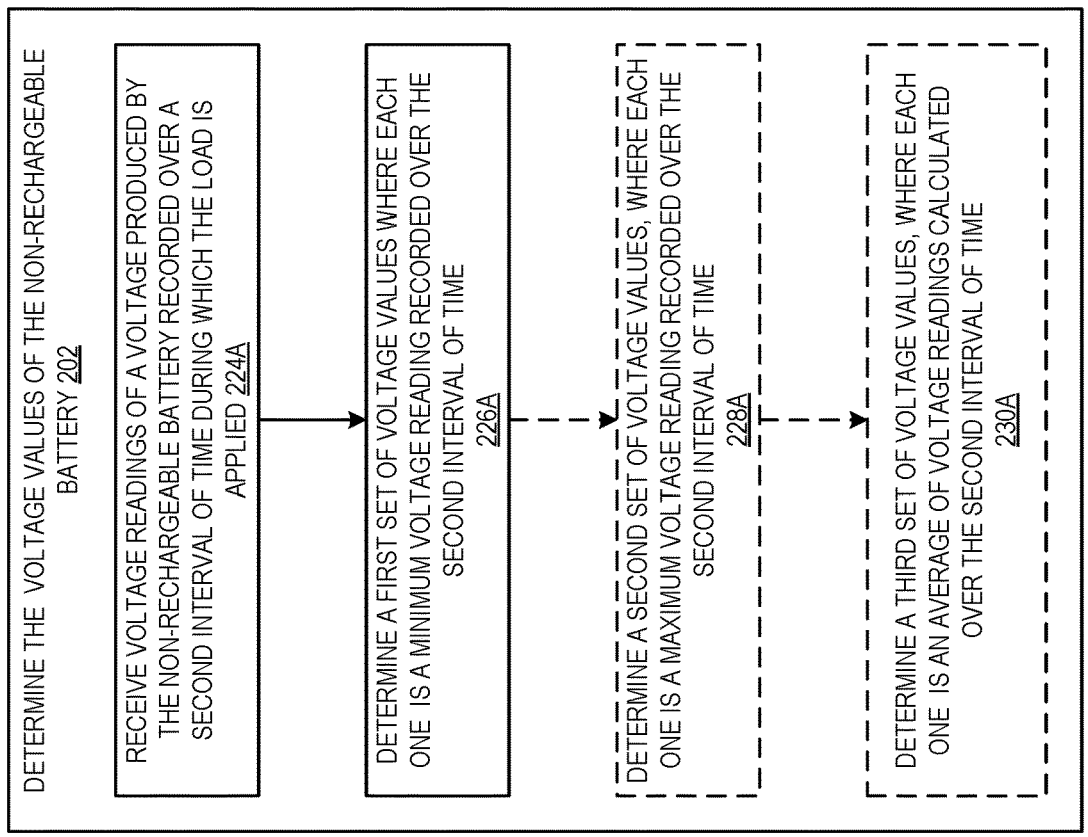
FIG. 2C illustrates a flow diagram of exemplary operations that can be performed when the management server performs the determination of the voltage values, in accordance with some embodiments.

In some embodiments, the determination of the voltage values is performed by the management server 140 as described with reference to FIG. 2C or FIG. 2D. In some embodiments, the management server 140 receives voltage readings of the voltage produced by the non-rechargeable battery recorded over the second interval of time at operation 224A. In some embodiments, upon receipt of the voltage readings, the management server 140 may determine the first set of voltage values, the second set of voltage values, and the third set of voltage values (operations 226A, 226A, and 230A) respectively. In some embodiments, the management server 140 may calculate additional or alternative voltage values based on the voltage reading (e.g., low pass filter or frequency analysis can be performed on the voltage readings). Each one of the first set of voltage values is a minimum voltage reading of the voltage produced by the non-rechargeable battery over the second interval of time. The minimum voltage reading is the smallest voltage reading recorded by the voltage sensor 103 during the second interval of time. Each one of the second set of voltage values is a maximum voltage reading of the voltage produced by the non-rechargeable battery recorded over the second interval of time. Each one of the third set of voltage values is an average of voltage readings of the voltage produced by the non-rechargeable battery calculated over the second interval of time. For example, when referring to FIG. 3A, 310 is the first set of voltage values; 312 is the second set of voltage values, and 313 is the third set of voltage values. Each value in one of the first set, the second set, or the third set corresponds to a single event. Multiple alternative embodiments can be implemented, in which the IoT device 110 can transmit different ones of these sets instead of having the management server 140 determining them. For example, in some embodiments, the IoT device 110 only transmits the minimum voltage recorded for an event and the management server 140 receives, operation 226B, this minimum for each one of the events in the first interval of time. In other embodiments, the IoT device 110 transmits the voltage readings, the minimum voltage, the maximum voltage, and the average resulting in the management server receiving (operations 224B-230B), the voltage readings, the minimums, the maximums, and the averages for the events that occur during the first interval of time.

Referring back to FIG. 2A, the flow of operations moves to operation 204, at which one or more temperature measurements of the IoT device are determined over the first interval of time. In some embodiments, operation 204 is not performed. For example, if the IoT device is deployed in an environment that has a controlled temperature, the temperature obtained by the IoT device would not be subject to substantial variations over the course of the first interval of time. In other embodiments, operation 204 is performed. In some embodiments, the determination of the temperature measurements may include the management server 140 receiving temperature measurements from the IoT device 110, and determining for voltage values associated temperature measurements. In other embodiments, the determination of the temperature measurements includes the IoT device 110 obtaining these measurements and determining associated voltage values. The IoT device 110 obtains the temperature measurements from an internal sensor (e.g., temperature sensor 105) or from an external sensor (e.g., a temperature sensor of another IoT device coupled with IoT device 110 through a wired or wireless connection). The IoT device 110 obtains temperature measurements at a given frequency. The frequency for recording temperature measurements is typically different from the frequency at which the voltage readings are recorded.

In some embodiments, the IoT device 110 may obtain the temperature measurements during an event. In some embodiments, a single temperature measurement is determined for each event. In other embodiments, several temperature measurements can be determined for each event. In other embodiments, the IoT device 110 may record sensor measurements when operating in the first mode and in the second mode. However, the IoT device 110 may only transmit these temperature measurements to the management server when operating in the first mode and does not transmit the measurements to the management server 140 when in the second mode. For example, in one embodiment, the IoT device 110 may record temperature measurements at a given frequency regardless of whether it is operating in a first mode or a second mode and may transmit the temperature measurements only when it is operating in the first mode. Thus, in this exemplary embodiment, the IoT device 110 may transmit temperature measurements that were recorded during an interval of time that is longer than the interval of time during which the IoT device operates in the first mode. In another embodiment, the IoT device 110 may record temperature measurements with the internal temperature sensor 105 only when it operates in the first mode. In this embodiment, when the IoT device 110 is in the second mode no temperature measurements are recorded.

FIG. 4A illustrates a block diagram of exemplary temperature measurements recorded by the IoT device over time, in accordance with some embodiments. In this example, the IoT device 110 obtained the temperature measurements 410 for the first interval of time (between January $23^{rd}$ to January $28^{th}$) and corresponds to the voltage values 321A-N recorded by the IoT device 110 during this same first interval of time. In this example, the measurements are obtained when the IoT device is operating in the first mode and in the second mode. There is no one to one relationship between the temperature measurements and the voltage values determined at events. The determination of the temperature measurements may include determining the temperature measurement that corresponds to a voltage value. In one embodiment, each one of the temperature measurements 410 has a timestamp that indicates a time at which the temperature measurement was recorded by sensor; each one of the voltage readings has a timestamp that indicates at time at which the voltage reading was recorded. Based on the timestamp of the temperature measurement and the timestamps of the voltage reading, one or more temperature measurements can be determined for a voltage reading. For example, for voltage values 321A, temperature measurements 412 can be determined. In the example of FIG. 4A, the temperature measurements 410 recorded over the first interval of time do not have a large variation between them. In fact, all of the temperature measurements are between 67 F and 74 F.

FIG. 4B illustrates a block diagram of exemplary temperature measurements recorded by the IoT device over time, in accordance with some embodiments. In this example, the IoT device 110 obtains the temperature measurements 410 for the first interval of time (between January 23$^{rd}$ to January 28$^{th}$). Each measurement is obtained when the IoT device is operating in the first mode. In other words, each one of the measurements is obtained during an event. These events are the same as the events that generated the voltage values illustrated in FIG. 3B. In this example, there is a one to one relationship between the temperature measurements and the voltage values in the same event. A temperature measurement represents the temperature around the time the voltage readings were recorded by the voltage sensor 103. As opposed to the example described in FIG. 4A where multiple temperature measurements are associated with a single event (e.g., temperature measurements 412 for voltage values 321A of the event on January 23$^{rd}$), in the example of FIG. 4B, a single temperature measurement is associated with the voltage values of an event. For example, temperature measurement 422A is associated with the voltage values 331A of the event of February 24$^{th}$ at 3 AM, and temperature measurement 424B is associated with the voltage values 331B of the event of February 24$^{th}$ at 3 PM. In addition to the temperature measurements, the IoT device 110 may obtain and transmit to the management sever 140 other types of sensor measurements. For example, the IoT device 110 may obtain (from an internal or external sensor) location readings (e.g., GPS locations) and transmit these location readings to the management server 140. Other sensor measurements can be transmitted.

Referring back to FIG. 2A, the flow of operations moves to operation 204, at which a determination of whether a voltage of the non-rechargeable battery has decreased for more than a predetermined threshold is performed based at least in part on the voltage values. This step can be performed by the IoT device 110 or by the management server 140. The determination of whether the voltage of the battery 102 has decreased for more than a predetermined threshold can be performed by comparing two voltage values and determining whether a recent voltage value is smaller than a reference voltage value. In some embodiments, the reference voltage value is an older voltage value determined for the IoT device 110. The older voltage value was determined during deployment of the IoT device 110 and before the recent voltage value. For example, the older voltage value provides from voltage readings that are recorded before voltage readings used for determining the recent voltage value (e.g., values 321N on January 29$^{th}$ and voltage values 321A, or voltage values 321B are compared). The older voltage value can be a voltage value when the battery is under load or alternatively when the no load is applied to the battery. In other embodiments, the reference voltage value is a fixed voltage value that corresponds to a typical no-load (also called open-circuit) voltage of the battery. For example, the fixed voltage value can be obtained from a datasheet of the battery as specified by the battery manufacturer. Several embodiments can be implemented for comparison of these two values.

When the difference between the reference voltage value and the recent voltage value is determined to be greater than a predetermined threshold associated with the IoT device 110, the flow of operations moves to operation 208. Alternatively, when the difference is smaller than the predetermined threshold, the flow of operations moves to operation 202 at which the process repeats and additional voltage values are determined to enable a continued monitoring of the health of the non-rechargeable battery 102 of the IoT device 110. The drop in the voltage is an indication that the battery's life is nearing an end. In some embodiments, the voltage values that are compared are minimum voltage values. In other embodiments, the voltage values that are compared can be average voltage values. As shown in FIGS. 3A-B, a drop in the voltage is more significant between minimum voltage readings than between average voltage readings or maximum voltage readings. Some embodiments will rely only on an identification of a drop in the voltage between minimum voltage readings. Additionally or alternatively, some embodiments, will rely on a combination of minimum voltage values and average voltage values to identify the drop in the voltage. In some embodiments, the threshold used for comparing voltage values and identifying the drop in the voltage is determined based on a model voltage profile that is associated with the IoT device 110. The model voltage profile can be determined as described with reference to FIG. 6.

In some embodiments, the determination of whether a voltage of the non-rechargeable battery has decreased for more than the predetermined threshold further depends on the temperature recorded. The temperature measurement(s) corresponding to the voltage readings is used to correct/compensate the voltage readings. As shown in FIG. 3B, while there is drop of the minimum voltage values recorded for the IoT device 110 over time during the first interval of time, the voltage values oscillate from lower values recorded at 3 AM each day to higher values recorded at 3 PM each day. The lower values are associated with a time during the day in which lower temperature measurements 422 were recorded (see corresponding temperatures in FIG. 4B). The higher values are associated with a time in the day (3 PM) at which higher temperature measurements 424 were recorded (see corresponding temperatures in FIG. 4B). Thus, in some embodiments, the determination of the drop in voltage can be further performed with voltage values that are associated with temperatures that are substantially similar. In some embodiments, temperature measurements are grouped into buckets, e.g., say every 10 C is a bucket, and voltage values are associated with temperature buckets. In some embodiments, an analysis can be performed to determine the sensitivity of the model of the battery 102 and corresponding temperature buckets are generated for the voltages of the battery. Thus, in the example of FIGS. 3A and 4A, the minimum voltage values 335, which correspond to the temperature measurements 422, are used in the determination of whether the voltage of the non-rechargeable battery 102 has decreased without considering the other voltage values. The selection of this set of voltage values is performed based on the temperature measurements 422.

Upon determining that the voltage of the non-rechargeable battery has decreased for more than the predetermined threshold, the operations 206 and 208, and optionally operation 210 are performed. At operation 206, a prediction of an end of life parameter value for the non-rechargeable battery is performed. The management server 140 or the IoT device 110 may determine one or more of end of life parameter value which includes one or more of a time left before the non-rechargeable battery fails, a number of events left to the IoT device before the non-rechargeable battery fails, a number of transitions from a first mode to another mode left for the IoT device, a time before which the non-rechargeable battery and/or the IoT device need to be replaced. The determination of the end of life parameter value can be performed based on the voltage value profile associated with the IoT device 110.

The flow of operations moves to operation 208, at which a notification is transmitted to the electronic device 150 of the administrator of the IoT device. The notification may include the end of life parameter. In some embodiments, the notification is a message indicating that the battery of the IoT device or the IoT device are about to fail and replacement is recommended. The notification can be an email, a text message, an automated phone call, a notification on an application used by the administrator to manage the IoT device 110. The notification can be displayed on a display device of the electronic device 150.

In some embodiments, in addition to sending the notification at operation 208, the management server 140 may further update the configuration of the IoT device 110. For example, the IoT device 110 can be reconfigured to wake-up at a lower frequency (e.g., transitions from second mode to first mode occur less frequently in a same interval of time). For example, instead of waking-up twice a day, the IoT device 110 can be configured to wake-up every other day until the battery is replaced. In other embodiments, the operations of the IoT device during an event can be updated. The IoT device 110 can be reconfigured to measure voltage readings at a lower frequency than the previous configuration; record sensor measurements at a lower frequency; and/or transmit the sensor measurements at a lower frequency. In other embodiments, the IoT device 110 can be reconfigured such that some operations are not performed during an event. For example, measure voltage readings, recording sensor measurements, and/or transmission of data is no longer performed until the battery is replaced.

Figure 6:
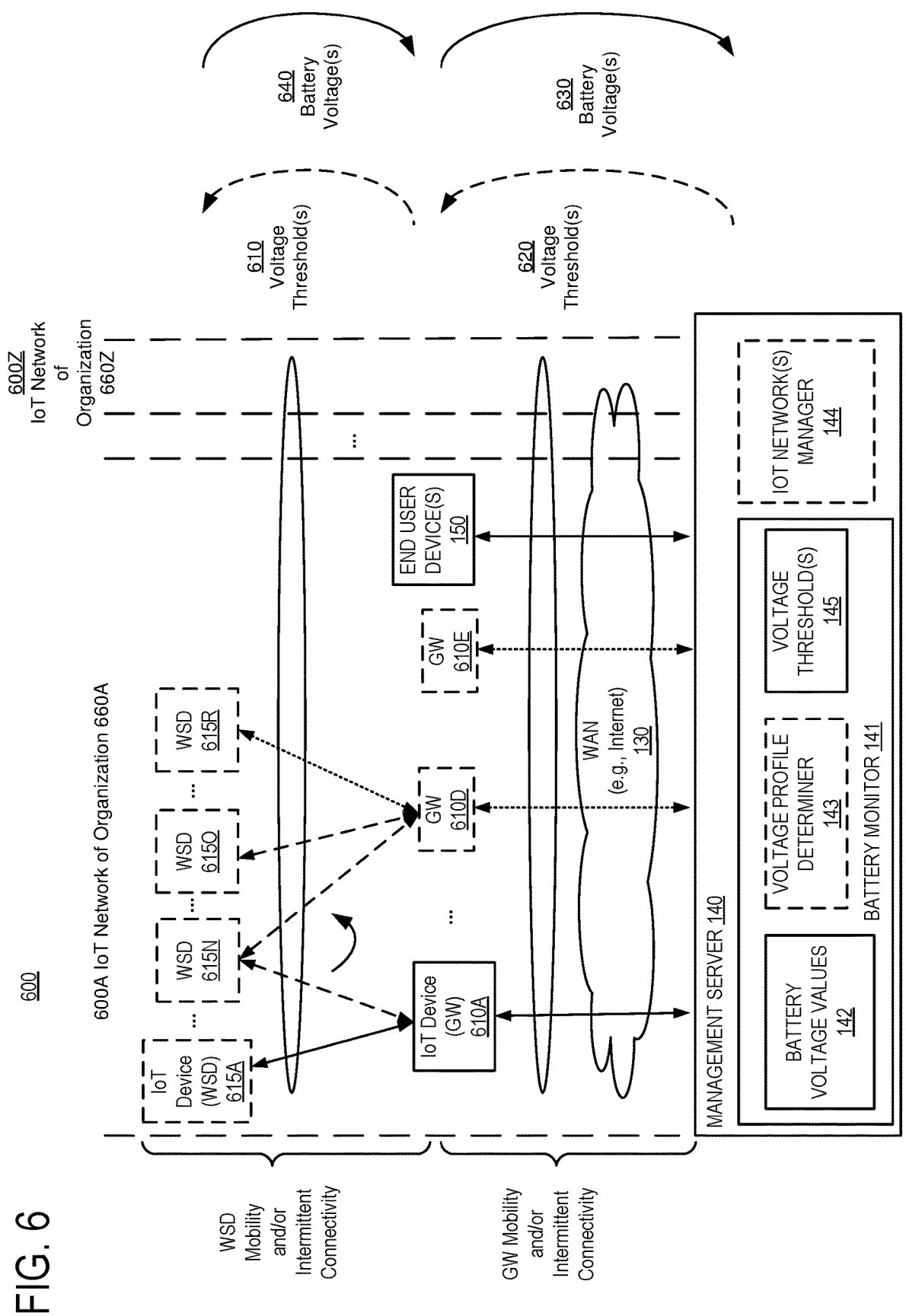
FIG. 6 illustrates a block diagram of exemplary IoT networks enabling the generation of model voltage profile, in accordance with some embodiments.

Generation of a Model Voltage Profile for a Non-Rechargeable Battery:

FIG. 5 illustrates an exemplary model voltage profile of an IoT device, in accordance with some embodiments. In some embodiments, a model voltage profile, e.g., the profile illustrates in FIG. 5, can be generated for an IoT device 110 by gathering and analyzing data recorded by one or multiple IoT devices similar to the IoT device 110 during an experimentation phase. The model voltage profile may include a first model profile 510, an optional second model profile 520, and an optional third model profile 530. In some embodiments, only one of the three model profiles is determined. In other embodiments, the three model profiles are determined. In one embodiment, a network 600 as illustrated in FIG. 6 can be deployed and may enable the recordation of voltage values for multiple IoT devices. The voltage values recorded are used for the generation of the model voltage profile 500. One embodiment measures the temperature at a relative low frequency and measures the voltage values at relatively high frequencies during wakeup events. The data is used to determine the minimum voltage values (and optionally the maximum voltage values and average voltage values) to store for each event. This data is used to build a profile reflecting the minimum voltages during wake ups occurring over time for an IoT device. In addition, this data can optionally be stored with the temperatures recorded closest to the events. In one embodiment, the data is obtained from multiple IoT devices deployed in multiple IoT networks. The analysis of the data stored is performed to determine the predetermined threshold value for an IoT device. In some embodiments, different IoT devices with different software and hardware capabilities, and/or different configurations can be deployed to obtain profiles for different types of IoT devices. Each type of IoT devices may be associated with a different profile such that the predetermined threshold may change based on the type of IoT device. In some embodiments, multiple profiles can be generated for a same IoT device. For example, different profiles can be determined for different ranges of temperatures.

FIG. 6 illustrates a block diagram of exemplary IoT networks 600 enabling the generation of model voltage profile, in accordance with some embodiments. The management server 140 provides an IoT networks service to one or more organizations. As illustrated in FIG. 6, the management server 140 may be coupled, through the WAN 130, to a plurality of gateway devices and wireless sensing devices forming multiple IoT networks (e.g., 600A-600Z) belonging to respective organizations (e.g., 610A-610Z). Each organization possesses a set of wireless sensing devices and gateways for monitoring physical events (e.g., monitoring the temperature of refrigerated goods being transported, monitoring fleets of vehicles by recording location, movement and/or acceleration information, monitoring humidity and/or temperature at various locations within a room or a building, etc.). In some embodiments, for each IoT network of a given organization, the IoT network is used to record voltage values of the battery of the deployed IoT devices (WSDs, or gateways) to determine the model voltage profile for one or multiple IoT devices. Once the profiles are determined, the IoT network service enables the monitoring of the health of the battery of the IoT devices in the network (e.g., gateways, and/or WSDs) enabling an accurate determination of when a battery/IoT device needs to be replaced. The model voltage profiles enable the determination of the predetermined voltage threshold for the IoT device. Further, the model voltage profiles enable the determination of end of life parameters and values of these parameters for each IoT device. In some embodiments, the illustrated IoT networks are deployed in a laboratory environment with controlled settings and configurations that are used to determine the voltage threshold and the model voltage profiles. Additionally or alternatively, the IoT networks are deployed in a real world environment for one or more tenants of the IoT network service and data received from these networks are analyzed to determine the voltage threshold and the model voltage profile(s). While embodiments herein describe the use of the IoT networks for recording voltage values used to generate the model voltage profiles, in other embodiments, the profiles can be obtained from a third party and other mechanisms can be used for determining the model voltage profile.

IoT Network 600A of organization 660A is an exemplary deployment of an IoT network including a plurality of IoT devices, which may include wireless sensing devices and gateway devices. The IoT network 600A includes a plurality of WSDs coupled with one or more gateway devices. For example, WSDs 615A to 615N are coupled to gateway device (GW) 610A, WSDs 6150 to 615R are coupled with GW 610D, etc. While four WSDs, and three gateway devices are illustrated, the IoT network 600A may include more WSDs and gateway devices. Each one of the gateway devices may be mobile or stationary. For example, the GW 610D may be a mobile gateway device located within a vehicle transporting goods, which also includes one or more mobile WSDs that can connect to the gateway device. The IoT network service enables the offload of data, which includes the offload of battery voltages (operations 640 and 630) from the wireless sensing devices (e.g., 615A-615N) to the management server 140 through a first communication channel between the GWs (e.g., GW 110A-110D) and the WSDs and through a second communication channel 1020 between the management server 140 and the GWs of the IoT network 600A. In some embodiments, a gateway device, e.g., GW 610E, may not be coupled to any WSDs, and the data transmitted to the management server 140 is data recorded by the gateway device.

In some embodiments, the IoT network service enables the WSDs to offload data to one of the gateway devices of the same organization as soon as one of the gateway devices is within range of the WSD and a connection is established, while deleting data only when a confirmation is received from the gateway devices. In addition, the gateway devices are operative to store the data from the WSDs and offload to the management server when a connection is established without deletion of the data prior to the receipt of an acknowledgement message from the management server. This ensures that all data transmitted from the WSDs is received at the management server 140 even in scenarios of mobility of the devices or intermittent connectivity. The management server 140 reconciles the data received from each WSD through one or more gateway devices (which may occur potentially following multiple connection interruptions or mobility of the WSD) to present to a user of the organization an uninterrupted representation of the sensor measurements of each WSD.

The IoT network service is a multi-tenant service and may process and manage data from various IoT networks (e.g., 660A, 660Z) belonging to different organizations while ensuring that data recorded by a WSD of a first organization (e.g., 610A) is not transmitted to a user of the second organization (e.g., 660Z). The management server 140 may store battery voltages 142 recorded over an interval of time by one or more of the IoT devices. Each voltage value is associated with a corresponding IoT device and represent a voltage reading of a voltage produced by the battery of that IoT device when under load. In some embodiments, the management server 140 includes a voltage profile determiner 143 that is operative to determine based on experimental data a model voltage profile for an IoT device. The profile is used to determine a voltage threshold (from voltage threshold 145). The voltage threshold is used during deployment of the IoT device by the battery monitor 141 to determine an EOL parameter value for the IoT device. The management server 140 may further include an IoT network manager 144 that is operative to manage the deployment and configuration of the IoT networks 600A-Z. In some embodiments, the IoT devices may be operative to receive a Voltage threshold and automatically determine a drop in the voltage causing a transition on the mode of operation of the IoT device.

The embodiments herein describe mechanisms for monitoring battery health in an IoT network. In one embodiment, it was determined that IoT devices that use non-rechargeable batteries and that have relatively accurate, high sampling frequency voltage sensors (and in some embodiments temperature and/or ability to report to backend) use a new technique for predicting the EOL of a battery. The new technique relies at least in part on voltage values that are recorded in the IoT device during the deployment of the IoT device. The use of high frequency voltage sensor enables an accurate evaluation of the voltages produced by the battery when the battery is under load. In one embodiment, the voltage is recorded when the battery is under a similar load over time. The monitoring of the voltage of the battery (e.g., the minimum voltage value) when the battery is under a same load (e.g., through the repeated execution of the same operations during events) enables an accurate prediction of one or more end of life parameters. This prediction can be used for a variety of purposes, including providing sufficiently early notifications to allow for battery or entire device replacement before the failure of the existing battery fails.

Exemplary Electronic Devices

Electronic Device and Machine-Readable Media

One or more parts of the above embodiments may include software and/or a combination of software and hardware. An electronic device (also referred to as a computing device, computer, etc.) includes hardware and software, such as a set of one or more processors coupled to one or more machine-readable storage media (e.g., magnetic disks, optical disks, read only memory (ROM), flash memory, phase change memory, solid state drives (SSDs)) to store code (which is composed of software instructions and which is sometimes referred to as computer program code or a computer program) for execution on the set of processors and/or to store data. For instance, an electronic device may include non-volatile memory (with slower read/write times, e.g., magnetic disks, optical disks, read only memory (ROM), Flash memory, phase change memory, SSDs) and volatile memory (e.g., dynamic random access memory (DRAM), static random access memory (SRAM)), where the non-volatile memory persists code/data even when the electronic device is turned off, or when power is otherwise removed, and the electronic device copies that part of the code that is to be executed by the set of processors of that electronic device from the non-volatile memory into the volatile memory of that electronic device during operation because volatile memory typically has faster read/write times. As another example, an electronic device may include a non-volatile memory (e.g., phase change memory) that persists code/data when the electronic device is turned off, and that has sufficiently fast read/write times such that, rather than copying the part of the code/data to be executed into volatile memory, the code/data may be provided directly to the set of processors (e.g., loaded into a cache of the set of processors); in other words, this non-volatile memory operates as both long-term storage and main memory, and thus the electronic device may have no or only a small amount of volatile memory for main memory. In addition to storing code and/or data on machine-readable storage media, typical electronic devices can transmit code and/or data over one or more machine-readable transmission media (also called a carrier) (e.g., electrical, optical, radio, acoustical or other form of propagated signals—such as carrier waves, infrared signals). For instance, typical electronic devices also include a set of one or more physical network interface(s) to establish network connections (to transmit and/or receive code and/or data using propagating signals) with other electronic devices. Thus, an electronic device may store and transmit (internally and/or with other electronic devices over a network) code and/or data with one or more machine-readable media (also referred to as computer-readable media).

Electronic devices are used for a variety of purposes. For example, an electronic device (sometimes referred to as a server electronic device) may execute code that cause it to operate as one or more servers used to provide a service to other electronic device(s) (sometimes referred to as a client electronic device, a client computing device, or a client device) that executes client software (sometimes referred to as client code or an end-user client) to communicate with the service. The server and client electronic devices may be operated by users respectively in the roles of administrator (also known as an administrative user) and end-user.

Alternative embodiments of an electronic device may have numerous variations from that described above. For example, customized hardware and/or accelerators might also be used in an electronic device.

Exemplary Environment

Figure 7:
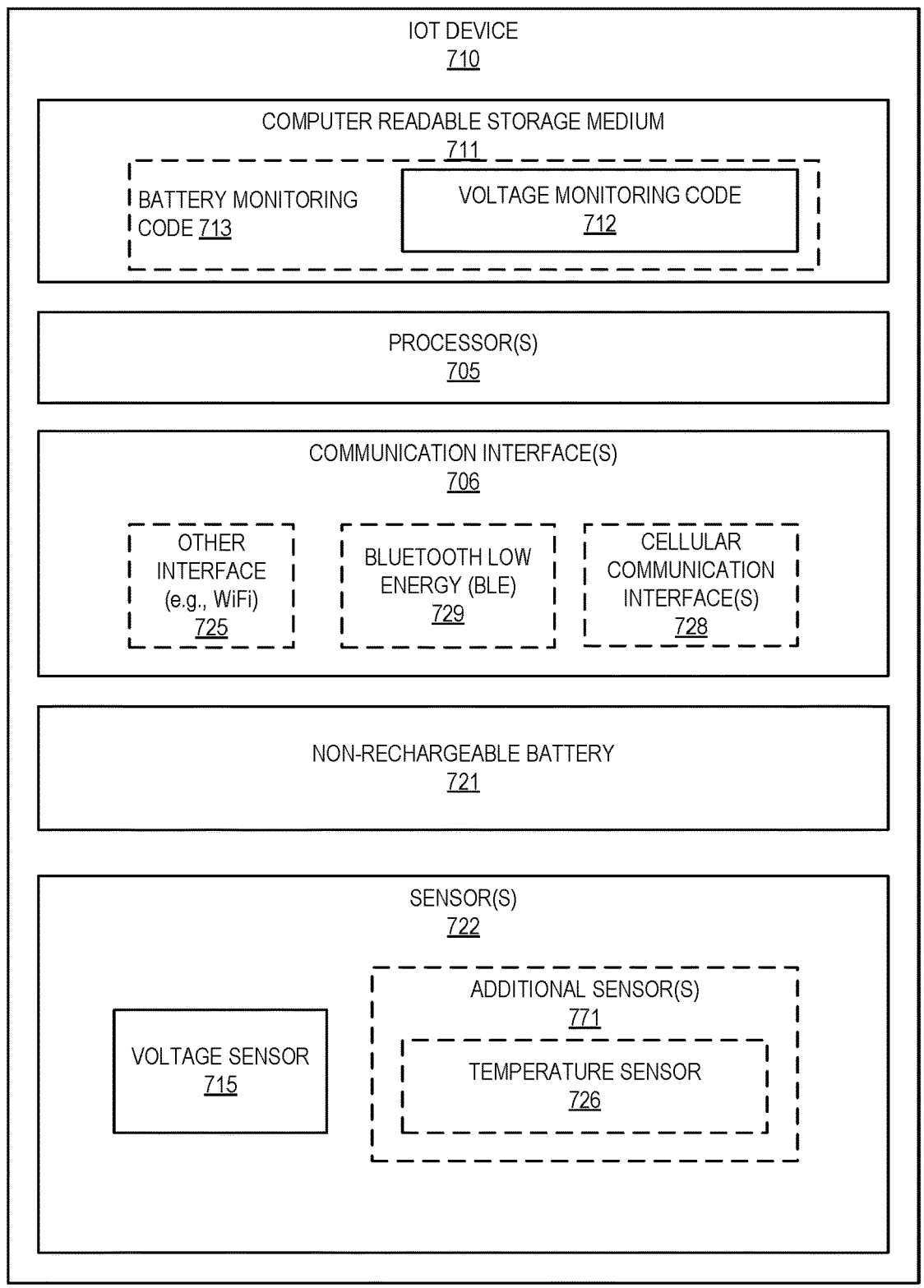
FIG. 7 illustrates a block diagram of an IoT device that can be used in some embodiments.

FIG. 7 illustrates a block diagram of an IoT device that can be used in some embodiments. IoT device 710 includes one or more processors 705 and a computer-readable storage medium 711, which is coupled to the processor(s) 705. The computer-readable storage medium 711 may be used for storing data, metadata, and programs for execution by the processor(s) 705. For example, the depicted computer-readable storage medium 711 may store voltage monitoring code 712 that, when executed by the processor(s) 705, causes the IoT device 710 (e.g., IoT device 110) to control the measurements of voltage readings, and transmit the data to the management server 140. In some embodiments, when the voltage monitoring code 712 is executed by the processor(s) 705, it causes the IoT device 710 to perform operations described with respect to FIGS. 1-6. In some embodiments, the voltage monitoring code 712 can be part of a battery monitory code 713, which when executed by the processor(s) 705 causes the IoT device 710 to monitor the health of the battery as described with reference to FIGS. 1-6. The IoT device 710 includes a non-rechargeable battery 721. The non-rechargeable battery (e.g., lithium thionyl chloride batteries), also known as primary battery or primary cells, is designed to be used once and discarded. In general, the electrochemical reaction occurring in the non-rechargeable battery is not reversible, rendering the cell unrechargeable. As the non-rechargeable battery is used, the chemicals in the battery are used up to generate power; when the chemicals are gone, the battery stops producing electricity. The non-rechargeable battery 721 powers the IoT device 710.

The IoT device 710 also includes one or more sensors used to record sensor measurements in response to physical events. For example, the IoT device 710 includes a voltage sensor 715. The voltage sensor 715 is coupled with the non-rechargeable battery 721 and is operative to measure the voltage produced by the non-rechargeable battery 721. In some embodiments, voltage sensor 715 is an analog-to-digital converter. While the voltage sensor 715 is illustrated as being separate from the processor(s), this should be seen as a logical representation presented for illustrative purposes only. In some embodiments, the voltage sensor 715 is built in a microcontroller (MCU) processing unit that is part of a printed circuit board in the IoT device. In other embodiments, the voltage sensor 715 is implemented as a separate component from the processor(s) 705. Voltage reading(s) are obtained from the measurements of the voltage produced by the non-rechargeable battery 721. In some embodiments, the voltage of the battery is measured when the battery is under load. In particular, the voltage of the battery can be measured when the IoT device is operating in a first mode of operation that is different from a sleep mode. In other embodiments, the voltage may be measured regardless of which mode of operation the IoT device is in. The IoT device 710 may include one or more additional sensors 771 (e.g., temperature sensor 726, humidity sensor, barometric pressure sensor, $CO_2$ concentration sensor, acceleration sensor, sound sensor, movement sensor, etc.). In some embodiments, one or more of the additional sensors can be integrated into the IoT device 710. In other embodiments, one or more of the additional sensors can be separate from the IoT device 710. When an additional sensor is separate from the IoT device 710, it can connect to the IoT device 710 through a wireless communication interface (e.g., a short-range communication interface such as BT or BLE, or other) or alternatively it can connect via a wired communication interface (e.g., a general-purpose input/output (GPIO)).

The IoT device 710 also includes one or more communication interfaces 706, which are provided to allow a user to provide input to, receive output from, and otherwise transfer data to and from the device. Exemplary Input/Output devices and interfaces include wired and wireless transceivers, such as Joint Test Action Group (JTAG) transceiver, a Bluetooth Low Energy (LE) transceiver 729 an IEEE 802.11 transceiver, an infrared transceiver, a wireless cellular communication interface (e.g., 2G, 3G, 4G, 5G, etc.) 728, a diagnostic port, or another wireless protocol 725 to connect the IoT device 710 with another device, external component, or a network, and receive stored instructions, data, tokens, etc. It will be appreciated that one or more buses may be used to interconnect the various components shown in FIG. 7.

It will be appreciated that additional components, not shown, may also be part of the IoT device 710, and, in certain embodiments, fewer components than that shown in FIG. 7, may also be used in an IoT device 710. In some embodiments, the IoT device 710 may act as a gateway system or alternatively as a wireless sensing device.

Figure 8:
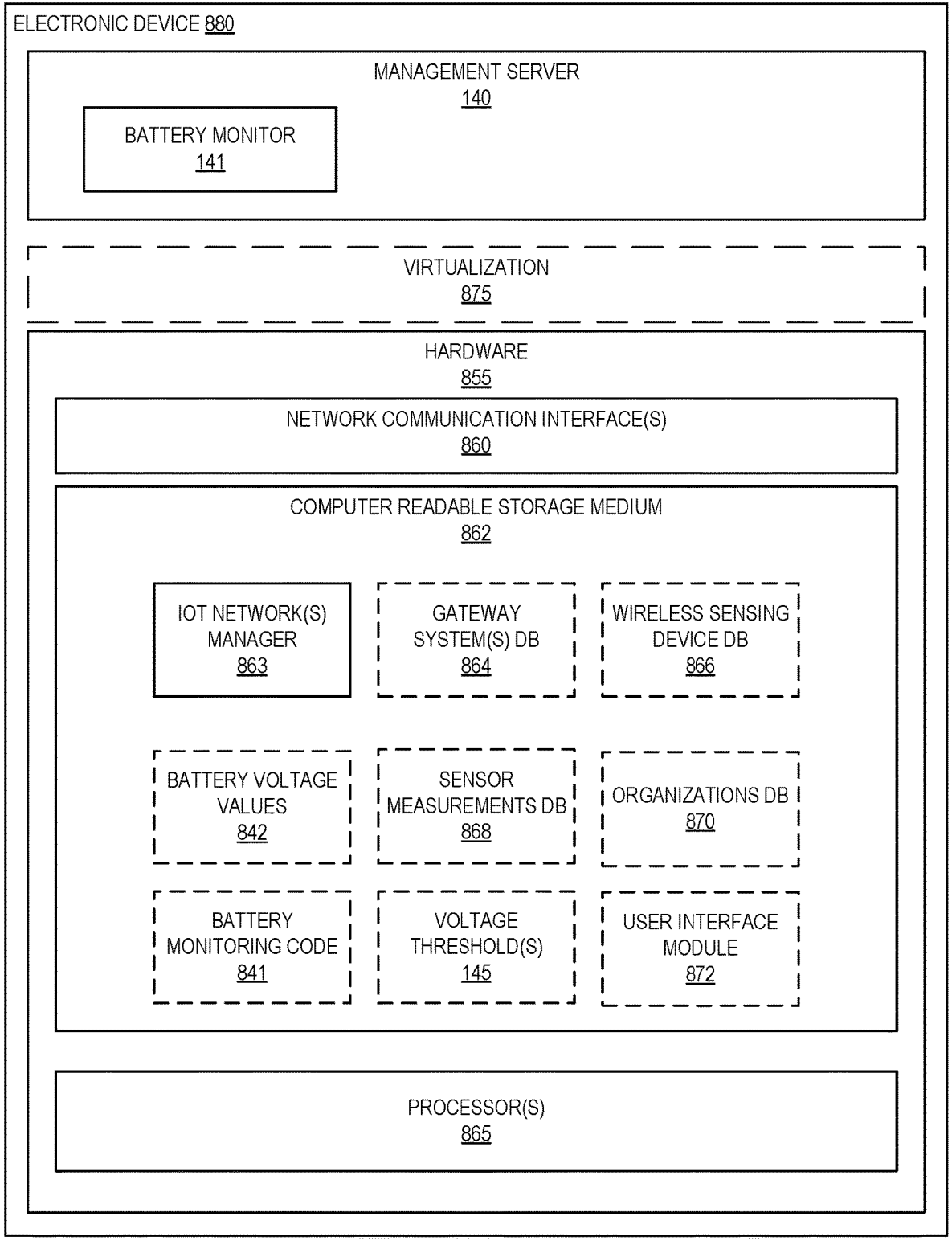
FIG. 8 illustrates a block diagram of an exemplary management server that can be used in some embodiments.

FIG. 8 illustrates a block diagram of an exemplary management server that can be used in some embodiments. Management server 140 may be a web or cloud server, or a cluster of servers, running on server hardware. In one embodiment, the management server 140 works for both single and multi-tenant installations, meaning that multiple organizations with different administrators may have IoT devices (e.g., wireless sensing devices and/or gateway systems) managed by the same management server.

According to one embodiment, management server 140 is implemented on an electronic device 880 which includes hardware 855. Hardware 855 includes network communication interfaces 860 coupled with one or more processor(s) 865, and a computer-readable storage medium 862. The computer-readable storage medium 862 includes an IoT network manager 863 used to configure and manage the IoT device(s) (e.g., IoT device 110) which may include gateway systems and/or wireless sensing device(s) for each organization. For example, the IoT network manager 863 may be operative to receive and manage information related to the IoT devices that belong to an organization. The IoT network manager 863 may be operative to receive information used to populate the gateway system database 864, the wireless sensing device database 866, and the organization database 870 with appropriate information when the WSDs and gateway systems are associated with an organization.

In an embodiment, the computer-readable storage medium 862 further includes a user interface module 872, which when executed on the processor(s)' 865 causes the display of a Web interface on a client device. The Web interface allows administrators and/or users to create and log into an account associated with an organization to which a set of IoT devices belong (e.g., IoT device 110). The user interface module 872 can be used for managing and configuring the IoT devices. The computer readable storage medium 862 further includes the sensor measurement database 878 (including data indicative of sensor measurements received from the IoT devices (e.g., temperature measurements)), optional gateway systems database 864 (including information regarding the gateway systems when the IoT devices include gateway systems), an optional wireless sensing device database 866 (including information regarding the WSDs when the IoT devices include WSDs), and an optional organizations database 870 (including information regarding the organizations to which the IoT devices belong). The computer readable storage medium 862 may further include battery voltage values 842 (including voltage readings, minimum voltage values, maximum voltage values, and/or average voltage values received from one or more IoT devices), voltage thresholds 145 (where each one of the thresholds is associated with an IoT device and/or a type of IoT devices), and battery monitoring code 841 (which when executed by the processors 865 cause the management server to execute the operations of a battery monitor 141 described with reference to FIG. 1-6.

While one embodiment does not implement virtualization, alternative embodiments may use different forms of virtualization—represented by a virtualization layer 875. In these embodiments, the management server 140, and the hardware that executes it, form a virtual management server which is a software instance of the modules stored on the computer-readable storage medium 862. In electronic devices that use compute virtualization, the set of one or more processor(s) 865 typically execute software to instantiate the virtualization layer 875 and software container(s) (e.g., with operating system-level virtualization, the virtualization layer 875 represents the kernel of an operating system (or a shim executing on a base operating system) that allows for the creation of multiple software containers (representing separate user space instances and also called virtualization engines, virtual private servers, or jails) that may each be used to execute a set of one or more applications; with full virtualization, the virtualization layer 875 represents a hypervisor (sometimes referred to as a virtual machine monitor (VMM)) or a hypervisor executing on top of a host operating system, and the software containers, each represent a tightly isolated form of a software container called a virtual machine that is run by the hypervisor and may include a guest operating system; with para-virtualization, an operating system or application running with a virtual machine may be aware of the presence of virtualization for optimization purposes). Again, in electronic devices where compute virtualization is used, during operation an instance of the software is executed within the software container on the virtualization layer 875. In electronic devices where compute virtualization is not used, the instance on top of a host operating system is executed on the "bare metal" electronic device. The instantiation of the instance, as well as the virtualization layer and software containers, if implemented, are collectively referred to as software instance(s). The electronic device 880 can be used to perform the operations of a management server as described with reference to FIGS. 1-6.

While some components of the IoT device or the management server are illustrated as code stored on the computer-readable storage medium, in other embodiments the modules may be implemented in hardware or in a combination of hardware and software.

CONCLUSION

In the above description, numerous specific details such as resource partitioning/sharing/duplication embodiments, types and interrelationships of system components, and logic partitioning/integration choices are set forth in order to provide a more thorough understanding. It will be appreciated, however, by one skilled in the art, that the invention may be practiced without such specific details. In other instances, control structures, logic embodiments, opcodes, means to specify operands, and full software instruction sequences have not been shown in detail since those of ordinary skill in the art, with the included descriptions, will be able to implement what is described without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Bracketed text and blocks with dashed borders (e.g., large dashes, small dashes, dot-dash, and dots) may be used herein to illustrate optional operations and/or structures that add additional features to some embodiments. However, such notation should not be taken to mean that these are the only options or optional operations, and/or that blocks with solid borders are not optional in certain embodiments.

In the following description and claims, the term "coupled," along with its derivatives, may be used. "Coupled" is used to indicate that two or more elements, which may or may not be in direct physical or electrical contact with each other, co-operate or interact with each other.

The operations in the flow diagrams are be described with reference to the exemplary embodiments in the other figures. However, the operations of the flow diagrams can be performed by embodiments other than those discussed with reference to the other figures, and the embodiments discussed with reference to these other figures can perform operations different from those discussed with reference to the flow diagrams.

While the above description includes several exemplary embodiments, those skilled in the art will recognize that the invention is not limited to the embodiments described and can be practiced with modification and alteration within the spirit and scope of the appended claims. The description is thus illustrative instead of limiting.

What is claimed is:

1. A method of monitoring a non-rechargeable battery of an Internet of Things (IoT) device, the method comprising:
   determining, over a first interval of time, one or more voltage values of the non-rechargeable battery determined when a load is applied to the non-rechargeable battery, wherein the voltage values include a first set of voltage values and each one of the first set of voltage values is a minimum voltage reading of the voltage produced by the non-rechargeable battery over a second interval of time during which the load is applied;
   determining based at least in part on the voltage values whether a voltage of the non-rechargeable battery has decreased for more than a predetermined threshold; and
   in response to determining based at least in part on the voltage values that the voltage of the non-rechargeable battery has decreased for more than the predetermined threshold, performing the following:
   predicting an end of life parameter value for the non-rechargeable battery, and
   transmitting, based on the end of life parameter value, a notification to an electronic device of an administrator of the IoT device.

2. The method of claim 1, wherein the determining based on the voltage values that a voltage of the non-rechargeable battery has decreased for more than a predetermined threshold includes:
determining that a difference between a first minimum voltage reading from the first set of voltage values and a reference voltage reading from the first set of voltage values is greater than the predetermined threshold.

3. The method of claim 1, wherein the voltage values include a second set of voltage values and a third set of voltage values, wherein each one of the second set of voltage values is a maximum voltage reading of the voltage produced by the non-rechargeable battery recorded over the second interval of time and each one of the third set of voltage values is an average of voltage readings of the voltage produced by the non-rechargeable battery calculated over the second interval of time.

4. The method of claim 1, wherein when the load is applied to the non-rechargeable battery, one or more sensor measurements are recorded by the IoT device.

5. The method of claim 1 further comprising:
determining, over the first interval of time, one or more temperature measurements of the IoT device when the load is applied to the non-rechargeable battery; and
wherein the determining based at least in part on the voltage values that a voltage of the non-rechargeable battery has decreased for more than a predetermined threshold is further based on the temperature measurements.

6. The method of claim 1, wherein when the load is applied to the non-rechargeable battery, one or more sensor measurements are transmitted from the IoT device towards a management server.

7. The method of claim 6, wherein the sensor measurements include one or more location readings of the IoT device, and temperature measurements.

8. The method of claim 1, wherein the method is performed in a management server that is operative to be coupled with the IoT device through a wide area network, and the determining the voltage values includes:
receiving the voltage values from the IoT device.

9. The method of claim 1, wherein the end of life parameter value includes one or more of a time left before the non-rechargeable battery fails, a number of events left to the IoT device before the non-rechargeable battery fails, a time before which the non-rechargeable battery and/or the IoT device need to be replaced.

10. A non-transitory machine-readable storage medium that provides instructions that, if executed by a processor will cause said processor to monitor a non-rechargeable battery of an Internet of Things (IoT) device by performing operations comprising:
determining, over a first interval of time, one or more voltage values of the non-rechargeable battery determined when a load is applied to the non-rechargeable battery, wherein the voltage values include a first set of voltage values and each one of the first set of voltage values is a minimum voltage reading of the voltage produced by the non-rechargeable battery over a second interval of time during which the load is applied;
determining based at least in part on the voltage values whether a voltage of the non-rechargeable battery has decreased for more than a predetermined threshold; and
in response to determining based at least in part on the voltage values that the voltage of the non-rechargeable battery has decreased for more than the predetermined threshold, performing the following:
predicting an end of life parameter value for the non-rechargeable battery, and
transmitting, based on the end of life parameter value, a notification to an electronic device of an administrator of the IoT device.

11. The non-transitory machine-readable storage medium of claim 10, wherein the determining based on the voltage values that a voltage of the non-rechargeable battery has decreased for more than a predetermined threshold includes:
determining that a difference between a first minimum voltage reading from the first set of voltage values and a reference voltage reading from the first set of voltage values is greater than the predetermined threshold.

12. The non-transitory machine-readable storage medium of claim 10, wherein the voltage values include a second set of voltage values and a third set of voltage values, wherein each one of the second set of voltage values is a maximum voltage reading of the voltage produced by the non-rechargeable battery recorded over the second interval of time and each one of the third set of voltage values is an average of voltage readings of the voltage produced by the non-rechargeable battery calculated over the second interval of time.

13. The non-transitory machine-readable storage medium of claim 10, wherein when the load is applied to the non-rechargeable battery, one or more sensor measurements are recorded by the IoT device.

14. The non-transitory machine-readable storage medium of claim 10, wherein the operations further comprise:
determining, over the first interval of time, one or more temperature measurements of the IoT device when the load is applied to the non-rechargeable battery; and
wherein the determining based at least in part on the voltage values that a voltage of the non-rechargeable battery has decreased for more than a predetermined threshold is further based on the temperature measurements.

15. The non-transitory machine-readable storage medium of claim 10, wherein when the load is applied to the non-rechargeable battery, one or more sensor measurements are transmitted from the IoT device towards a management server.

16. The non-transitory machine-readable storage medium of claim 15, wherein the sensor measurements include one or more location readings of the IoT device, and temperature measurements.

17. The non-transitory machine-readable storage medium of claim 10, wherein the operations are performed in a management server that is operative to be coupled with the IoT device through a wide area network, and the determining the voltage values includes:
receiving the voltage values from the IoT device.

18. The non-transitory machine-readable storage medium of claim 10, wherein the end of life parameter value includes one or more of a time left before the non-rechargeable battery fails, a number of events left to the IoT device before the non-rechargeable battery fails, a time before which the non-rechargeable battery and/or the IoT device need to be replaced.

19. A system for monitoring a non-rechargeable battery of an Internet of Things (IoT) device, the system comprising:
one or more processors; and
a non-transitory machine-readable storage medium that provides instructions that, if executed by the one or more processors to perform operations comprising,
determining, over a first interval of time, one or more voltage values of the non-rechargeable battery determined when a load is applied to the non-rechargeable battery, wherein the voltage values include a first set of voltage values and each one of the first set of voltage values is a minimum voltage reading of the voltage produced by the non-rechargeable battery over a second interval of time during which the load is applied;

determining based at least in part on the voltage values whether a voltage of the non-rechargeable battery has decreased for more than a predetermined threshold; and in response to determining based at least in part on the voltage values that the voltage of the non-rechargeable battery has decreased for more than the predetermined threshold, performing the following:
predicting an end of life parameter value for the non-rechargeable battery, and
transmitting, based on the end of life parameter value, a notification to an electronic device of an administrator of the IoT device.

20. The system of claim 19, wherein the determining based on the voltage values that a voltage of the non-rechargeable battery has decreased for more than a predetermined threshold includes:
determining that a difference between a first minimum voltage reading from the first set of voltage values and a reference voltage reading from the first set of voltage values is greater than the predetermined threshold.

21. The system of claim 19, wherein the voltage values include a second set of voltage values and a third set of voltage values, wherein each one of the second set of voltage values is a maximum voltage reading of the voltage produced by the non-rechargeable battery recorded over the second interval of time and each one of the third set of voltage values is an average of voltage readings of the voltage produced by the non-rechargeable battery calculated over the second interval of time.

22. The system of claim 19, wherein when the load is applied to the non-rechargeable battery, one or more sensor measurements are recorded by the IoT device.

23. The system of claim 19, wherein the operations further comprise:
determining, over the first interval of time, one or more temperature measurements of the IoT device when the load is applied to the non-rechargeable battery; and
wherein the determining based at least in part on the voltage values that a voltage of the non-rechargeable battery has decreased for more than a predetermined threshold is further based on the temperature measurements.

24. The system of claim 19, wherein when the load is applied to the non-rechargeable battery, one or more sensor measurements are transmitted from the IoT device towards a management server.

25. The system of claim 24, wherein the sensor measurements include one or more location readings of the IoT device, and temperature measurements.

26. The system of claim 19, wherein the system is a management server that is operative to be coupled with the IoT device through a wide area network, and the determining the voltage values includes:
receiving the voltage values from the IoT device.

27. The system of claim 19, wherein the end of life parameter value includes one or more of a time left before the non-rechargeable battery fails, a number of events left to the IoT device before the non-rechargeable battery fails, a time before which the non-rechargeable battery and/or the IoT device need to be replaced.

* * * * *